United States Patent
Or-Bach et al.

(10) Patent No.: US 11,158,652 B1
(45) Date of Patent: *Oct. 26, 2021

(54) 3D MEMORY SEMICONDUCTOR DEVICES AND STRUCTURES

(71) Applicant: Monolithic 3D Inc., Klamath Falls, OR (US)

(72) Inventors: Zvi Or-Bach, Haifa (IL); Jin-Woo Han, San Jose, CA (US); Eli Lusky, Ramat-Gan (IL)

(73) Assignee: MONOLITHIC 3D INC., Klamath Falls, OR (US)

(*) Notice: Subject to any disclaimer, the term of this patent is extended or adjusted under 35 U.S.C. 154(b) by 0 days.

This patent is subject to a terminal disclaimer.

(21) Appl. No.: 17/346,295

(22) Filed: Jun. 14, 2021

Related U.S. Application Data

(63) Continuation-in-part of application No. 17/235,879, filed on Apr. 20, 2021, now Pat. No. 11,069,697, (Continued)

(51) Int. Cl.
| | |
|---|---|
| *G11C 16/04* | (2006.01) |
| *H01L 27/11582* | (2017.01) |
| *H01L 27/11556* | (2017.01) |
| *H01L 27/11519* | (2017.01) |
| *H01L 27/11524* | (2017.01) |

(Continued)

(52) U.S. Cl.
CPC .......... *H01L 27/11582* (2013.01); *G11C 7/18* (2013.01); *H01L 27/1157* (2013.01); *H01L 27/11519* (2013.01); *H01L 27/11524* (2013.01); *H01L 27/11529* (2013.01); *H01L 27/11556* (2013.01); *H01L 27/11565* (2013.01); *H01L 27/11573* (2013.01)

(58) Field of Classification Search
CPC ..... G11C 16/04; G11C 16/10; G11C 16/0466; G11C 16/14; H01L 27/11582
USPC ........................................ 365/185.17
See application file for complete search history.

(56) References Cited

U.S. PATENT DOCUMENTS

| | | |
|---|---|---|
| 3,007,090 A | 10/1961 | Rutz |
| 3,819,959 A | 6/1974 | Chang et al. |

(Continued)

FOREIGN PATENT DOCUMENTS

| | | |
|---|---|---|
| EP | 1267594 A2 | 12/2002 |
| WO | PCT/US2008/063483 | 5/2008 |

OTHER PUBLICATIONS

Colinge, J. P., et al., "Nanowire transistors without Junctions", Nature Nanotechnology, Feb. 21, 2010, pp. 1-5.

(Continued)

*Primary Examiner* — Harry W Byrne
(74) *Attorney, Agent, or Firm* — PowerPatent; Bao Tran

(57) ABSTRACT

A 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, where the channel is horizontally oriented, and where the channel is isolated from another channel disposed directly above the channel.

20 Claims, 15 Drawing Sheets

Related U.S. Application Data which is a continuation-in-part of application No. 17/099,706, filed on Nov. 16, 2020, now Pat. No. 11,018,156, which is a continuation-in-part of application No. 16/836,659, filed on Mar. 31, 2020, now Pat. No. 10,892,016.

(60) Provisional application No. 62/952,222, filed on Dec. 21, 2019, provisional application No. 62/897,364, filed on Sep. 8, 2019, provisional application No. 62/856,732, filed on Jun. 3, 2019, provisional application No. 62/831,080, filed on Apr. 8, 2019.

(51) Int. Cl.
*G11C 7/18* (2006.01)
*H01L 27/11565* (2017.01)
*H01L 27/1157* (2017.01)
*H01L 27/11573* (2017.01)
*H01L 27/11529* (2017.01)

(56) References Cited

U.S. PATENT DOCUMENTS

| | | |
|---|---|---|
| 4,009,483 A | 2/1977 | Clark |
| 4,197,555 A | 4/1980 | Uehara et al. |
| 4,213,139 A | 7/1980 | Rao et al. |
| 4,400,715 A | 8/1983 | Barbee et al. |
| 4,487,635 A | 12/1984 | Kugimiya et al. |
| 4,510,670 A | 4/1985 | Schwabe |
| 4,522,657 A | 6/1985 | Rohatgi et al. |
| 4,612,083 A | 9/1986 | Yasumoto et al. |
| 4,643,950 A | 2/1987 | Ogura et al. |
| 4,704,785 A | 11/1987 | Curran |
| 4,711,858 A | 12/1987 | Harder et al. |
| 4,721,885 A | 1/1988 | Brodie |
| 4,732,312 A | 3/1988 | Kennedy et al. |
| 4,733,288 A | 3/1988 | Sato |
| 4,829,018 A | 5/1989 | Wahlstrom |
| 4,854,986 A | 8/1989 | Raby |
| 4,866,304 A | 9/1989 | Yu |
| 4,939,568 A | 7/1990 | Kato et al. |
| 4,956,307 A | 9/1990 | Pollack et al. |
| 5,012,153 A | 4/1991 | Atkinson et al. |
| 5,032,007 A | 7/1991 | Silverstein et al. |
| 5,047,979 A | 9/1991 | Leung |
| 5,087,585 A | 2/1992 | Hayashi |
| 5,093,704 A | 3/1992 | Sato et al. |
| 5,106,775 A | 4/1992 | Kaga et al. |
| 5,152,857 A | 10/1992 | Ito et al. |
| 5,162,879 A | 11/1992 | Gill |
| 5,189,500 A | 2/1993 | Kusunoki |
| 5,217,916 A | 6/1993 | Anderson et al. |
| 5,250,460 A | 10/1993 | Yamagata et al. |
| 5,258,643 A | 11/1993 | Cohen |
| 5,265,047 A | 11/1993 | Leung et al. |
| 5,266,511 A | 11/1993 | Takao |
| 5,277,748 A | 1/1994 | Sakaguchi et al. |
| 5,286,670 A | 2/1994 | Kang et al. |
| 5,294,556 A | 3/1994 | Kawamura |
| 5,308,782 A | 5/1994 | Mazure et al. |
| 5,312,771 A | 5/1994 | Yonehara |
| 5,317,236 A | 5/1994 | Zavracky et al. |
| 5,324,980 A | 6/1994 | Kusunoki |
| 5,355,022 A | 10/1994 | Sugahara et al. |
| 5,371,037 A | 12/1994 | Yonehara |
| 5,374,564 A | 12/1994 | Bruel |
| 5,374,581 A | 12/1994 | Ichikawa et al. |
| 5,424,560 A | 6/1995 | Norman et al. |
| 5,475,280 A | 12/1995 | Jones et al. |
| 5,478,762 A | 12/1995 | Chao |
| 5,485,031 A | 1/1996 | Zhang et al. |
| 5,498,978 A | 3/1996 | Takahashi et al. |
| 5,527,423 A | 6/1996 | Neville et al. |
| 5,535,342 A | 7/1996 | Taylor |
| 5,554,870 A | 9/1996 | Fitch et al. |
| 5,563,084 A | 10/1996 | Ramm et al. |
| 5,583,349 A | 12/1996 | Norman et al. |
| 5,583,350 A | 12/1996 | Norman et al. |
| 5,586,291 A | 12/1996 | Lasker |
| 5,594,563 A | 1/1997 | Larson |
| 5,604,137 A | 2/1997 | Yamazaki et al. |
| 5,617,991 A | 4/1997 | Pramanick et al. |
| 5,627,106 A | 5/1997 | Hsu |
| 5,656,548 A | 8/1997 | Zavracky et al. |
| 5,656,553 A | 8/1997 | Leas et al. |
| 5,659,194 A | 8/1997 | Iwamatsu |
| 5,670,411 A | 9/1997 | Yonehara |
| 5,681,756 A | 10/1997 | Norman et al. |
| 5,695,557 A | 12/1997 | Yamagata et al. |
| 5,701,027 A | 12/1997 | Gordon et al. |
| 5,707,745 A | 1/1998 | Forrest et al. |
| 5,714,395 A | 2/1998 | Bruel |
| 5,721,160 A | 2/1998 | Forrest et al. |
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strife |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |

(56) References Cited

U.S. PATENT DOCUMENTS

| | | | |
|---|---|---|---|
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,559,500 B2 * | 5/2003 | Torii ................ G11C 16/06 |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,735,127 B2 * | 5/2004 | Torii ................ G11C 16/34 |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |

(56) References Cited

U.S. PATENT DOCUMENTS

| | | |
|---|---|---|
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,264,065 B2 | 9/2012 | Su et al. |
| 8,266,560 B2 | 9/2012 | McIlrath |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto et al. |
| 8,525,342 B2 | 10/2013 | Chandrasekaran |
| 8,546,956 B2 | 10/2013 | Nguyen |

(56) References Cited

U.S. PATENT DOCUMENTS

| | | |
|---|---|---|
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,319 B2 * | 3/2017 | Lee .................. H01L 27/11582 |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0151123 A1 * | 10/2002 | Torii .................. G11C 16/04 |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067030 A1 * | 4/2003 | Torii .................. G11C 16/04 |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonelli et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |

(56) References Cited

U.S. PATENT DOCUMENTS

| | | |
|---|---|---|
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0065365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |

(56) References Cited

U.S. PATENT DOCUMENTS

| | | |
|---|---|---|
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |

(56) References Cited

U.S. PATENT DOCUMENTS

| | | |
|---|---|---|
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0314833 A1* | 10/2016 | Lee .................... G11C 11/5628 |
| 2016/0343687 A1 | 11/2016 | Vadhavkar |
| 2017/0053688 A1* | 2/2017 | Seo .................... H01L 27/228 |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker |
| 2018/0090219 A1 | 3/2018 | Harari |
| 2018/0090368 A1 | 3/2018 | Kim |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner |
| 2019/0157296 A1 | 5/2019 | Harari et al. |
| 2020/0020408 A1 | 1/2020 | Norman et al. |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T. et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.

Burr, G. W., et al., "Overview of candidate device technologies for storage-class memory," IBM Journal of Research and Development, vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enchanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.

Iwai, H., et al., "NiSi Salicide Technology for Scaled CMOS," Microelectronic Engineering, 60 (2002), pp. 157-169.

Froment, B., et.al., "Nickel vs. Cobalt Silicide integration forsub-50nm CMOS", IMEC ESS Circuits, 2003. pp. 215-219.

James, D., "65 and 45-nm Devices—an Overview", Semicon West, Jul. 2008, paper No. ctr_024377.

Davis, J.A., et.al., "Interconnect Limits on Gigascale Integration(GSI) in the 21st Century", Proc. IEEE, vol. 89, No. 3, pp. 305-324, Mar. 2001.

Shino, T., et al., "Floating Body RAM Technology and its Scalability to 32nm Node and Beyond," Electron Devices Meeting, 2006, IEDM '06, International, pp. 1-4, Dec. 11-13, 2006.

Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.

Okhonin, S., et al., "New Generation of Z-RAM", Electron Devices Meeting, 2007. IEDM 2007. IEEE International, pp. 925-928, Dec. 10-12, 2007.

Henttinen, K. et al., "Mechanically Induced Si Layer Transfer in Hydrogen-Implanted Si Wafers," Applied Physics Letters, Apr. 24, 2000, p. 2370-2372, vol. 76, No. 17.

Lee, C.-W., et al., "Junctionless multigate field-effect transistor," Applied Physics Letters, vol. 94, pp. 053511-1 to 053511-2, 2009.

Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.

Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.

Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.

Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.

Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.

Henttinen, K. et al., "Cold ion-cutting of hydrogen implanted Si," J. Nucl. Instr, and Meth. in Phys. Res. B, 2002, pp. 761-766, vol. 190.

(56) References Cited

OTHER PUBLICATIONS

Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.
Wierer, J.J. et al., "High-power AlGaInN flip-chip light-emitting diodes, " Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.

Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions on Computer-Aided Design of Integrated Circuits and Systems, vol. 23, No. 4, Apr. 2004.
Abrmovici, M., et al., A reconfigurable design-for-debug infrastructure for SoCs, (2006) Proceeding—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings DATE, pp. 1338-1343.

(56) References Cited

OTHER PUBLICATIONS

McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-GB/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS MANTECH Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.
Zhu, S., et al., "N-Type Schottky Barrier Source/Drain MOSFET Using Ytterbium Silicide", IEEE Electron Device Letters, vol. 25, No. 8, Aug. 2004, pp. 565-567.
Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.
Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.
Awano, M., et al., "Advanced DSS MOSFET Technology for Ultrahigh Performance Applications", 2008 Symposium on VLSI Technology Digest of Technical Papers, pp. 24-25.
Choi, S.-J., et al., "Performance Breakthrough in NOR Flash Memory with Dopant-Segregated Schottky-Barrier (DSSB) SONOS Devices", 2009 Symposium of VLSI Technology Digest, pp. 222-223.
Zhang, M., et al., "Schottky barrier height modulation using dopant segregation in Schottky-barrier SOI-MOSFETs", Proceeding of ESSDERC, Grenoble, France, 2005, pp. 457-460.
Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.
Ko, C.H., et al., "NiSi Schottky Barrier Process-Strained Si (SB-PSS) CMOS Technology for High Performance Applications", 2006 Symposium on VLSI Technology Digest of Technical Papers.
Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.
Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.
Kaneko, A., et al., "High-Performance FinFET with Dopant-Segregated Schottky Source/Drain", IEDM 2006.
Kinoshita, A., et al., "Ultra Low Voltage Operations in Bulk CMOS Logic Circuits with Dopant Segregated Schottky Source/Drain Transistors", IEDM 2006.
Kinoshita, A., et al., "Comprehensive Study on Injection Velocity Enhancement in Dopant-Segregated Schottky MOSFETs", IEDM 2006.
Choi, S.-J., et al., "High Speed Flash Memory and 1T-DRAM on Dopant Segregated Schottky Barrier (DSSB) FinFET SONOS Device for Multi-functional SoC Applications", 2008 IEDM, pp. 223-226.

(56) References Cited

OTHER PUBLICATIONS

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

Azevedo, I. L., et al., "The Transition to Solid-State Lighting", Proc. IEEE, vol. 97, No. 3, Mar. 2009, pp. 481-510.

Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.

Tong, Q.-Y., et al., "A "smarter-cut" approach to low temperature silicon layer transfer", Applied Physics Letters, vol. 72, No. 1, Jan. 5, 1998, pp. 49-51.

Tong, Q.-Y., et al., "Low Temperature Si Layer Splitting", Proceedings 1997 IEEE International SOI Conference, Oct. 1997, pp. 126-127.

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Agarwal, A., et al., "Efficient production of silicon-on-insulator films by co-implantation of He+ with H+'" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Guseynov, N. A., et al., "Ultrasonic Treatment Restores the Photo-electric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Miller, D.A.B., "Optical interconnects to electronic chips," Applied Optics, vol. 49, No. 25, Sep. 1, 2010, pp. F59-F70.

En, W. G., et al., "The Genesis Process": A New SOI wafer fabrication method, Proceedings 1998 IEEE International SOI Conference, Oct. 1998, pp. 163-164.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C.," Japanese Journal of Applied Physics, vol. 46, No. 3B, 2007, pp. 1245-1249.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate SiO2," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

Faynot, O. et al., "Planar Fully depleted SOI technology: A Powerful architecture for the 20nm node and beyond," Electron Devices Meeting (IEDM), 2010 IEEE International, vol. No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al.,"Advanced Integration Technology for a Highly Scalable SOI DRAM with SOC (Silicon-On-Capacitors)", IEDM 1996, pp. 96-605-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

Choi, Sung-Jin, et al., "Performance Breakthrough in NOR Flash Memory with Dopant-Segregated Schottky-Barrier (DSSB) SONOS Devices," paper 11B-3, 2009 Symposium on VLSI Technology, Digest of Technical Papers, pp. 222-223.

Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

Topol, A.W., et al., "Enabling SOI-Based Assembly Technology for Three-Dimensional (3D) Integrated Circuits (ICs)," IEDM Tech. Digest, Dec. 2005, pp. 363-366.

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol. No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-SONOS Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et al., "Direct bonding for wafer level 3D integration", ICICDT 2010, pp. 110-113.

(56) References Cited

OTHER PUBLICATIONS

Kim, W., et al., "Multi-Layered Vertical Gate NAND Flash Overcoming Stacking Limit for Terabit Density Storage," Symposium on VLSI Technology, 2009, pp. 188-189.
Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.
Hubert, A., et al., "A Stacked SONOS Technology, Up to 4 Levels and 6nm Crystalline Nanowires, with Gate-All-Around or Independent Gates (ΦFlash), Suitable for Full 3D Integration", International Electron Devices Meeting, 2009, pp. 637-640.
Celler, G.K. et al., "Frontiers of silicon-on-insulator," J. App. Phys., May 1, 2003, pp. 4955-4978, vol. 93, No. 9.
Rajendran, B., et al., "Electrical Integrity of MOS Devices in Laser Annealed 3D IC Structures", proceedings VLSI Multi Level Interconnect Conference 2004, pp. 73-74.
Rajendran, B., "Sequential 3D IC Fabrication: Challenges and Prospects", Proceedings of VLSI Multi Level Interconnect Conference 2006, pp. 57-64.
Jung, S.-M., et al., "The revolutionary and truly 3-dimensional 25F2 SRAM technology with the smallest S3 (stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.
Hui, K. N., et al., "Design of vertically-stacked polychromatic light-emitting diodes," Optics Express, Jun. 8, 2009, pp. 9873-9878, vol. 17, No. 12.
Chuai, D. X., et al., "A Trichromatic Phosphor-Free White Light-Emitting Diode by Using Adhesive Bonding Scheme," Proc. SPIE, 2009, vol. 7635.
Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.
Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.
Flamand, G. et al., "Towards Highly Efficient 4-Temiinal Mechanical Photovoltaic Stacks," III-Vs Review, Sep.-Oct. 2006, pp. 24-27, vol. 19, Issue 7.
Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.
Sekar, D. C., et al., "A 3D-IC Technology with Integrated Microchannel Cooling", Proc. Intl. Interconnect Technology Conference, 2008, pp. 13-15.
Brunschweiler, T., et al., "Forced Convective Interlayer Cooling in Vertically Integrated Packages," Proc. Intersoc. Conference on Thermal Management (ITHERM), 2008, pp. 1114-1125.
Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.
Motoyoshi, M., "3D-IC Integration," 3rd Stanford and Tohoku University Joint Open Workshop, Dec. 4, 2009, pp. 1-52.
Wong, S., et al., "Monolithic 3D Integrated Circuits," VLSI Technology, Systems and Applications, 2007, International Symposium on VLSI-TSA 2007, pp. 1-4.
Batude, P., et al., "Advances in 3D CMOS Sequential Integration," 2009 IEEE International Electron Devices Meeting (Baltimore, Maryland), Dec. 7-9, 2009, pp. 345-348.
Tan, C.S., et al., "Wafer Level 3-D ICs Process Technology," ISBN-10: 0387765328, Springer, 1st Ed., Sep. 19, 2008, pp. v-xii, 34, 58, and 59.
Yoon, S.W. et al., "Fabrication and Packaging of Microbump Interconnections for 3D TSV," IEEE International Conference on 3D System Integration (3DIC), Sep. 28-30, 2009, pp. 1-5.

Franzon, P.D. et al., "Design and CAD for 3D Integrated Circuits," 45th ACM/IEEE Design, Automation Conference (DAC), Jun. 8-13, 2008, pp. 668-673.
Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.
Dong, C. et al., "Reconfigurable Circuit Design with Nanomaterials," Design, Automation & Test in Europe Conference & Exhibition, Apr. 20-24, 2009, pp. 442-447.
Razavi, S.A., et al., "A Tileable Switch Module Architecture for Homogeneous 3D FPGAs," IEEE International Conference on 3D System Integration (3DIC), Sep. 28-30, 2009, 4 pages.
Bakir M., et al., "3D Device-Stacking Technology for Memory," Chptr. 13.4, pp. 407-410, in "Integrated Interconnect Technologies for 3D Nano Electronic Systems", 2009, Artech House.
Weis, M. et al., "Stacked 3-Dimensional 6T SRAM Cell with Independent Double Gate Transistors," IC Design and Technology, May 18-20, 2009.
Doucette, P., "Integrating Photonics: Hitachi, Oki Put LEDs on Silicon," Solid State Technology, Jan. 2007, p. 22, vol. 50, No. 1.
Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.
Zahler, J.M. et al., "Wafer Bonding and Layer Transfer Processes for High Efficiency Solar Cells," NCPV and Solar Program Review Meeting, 2003, pp. 723-726.
Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.
Kada, M., "Development of functionally innovative 3D-integrated circuit (dream chip) technology / high-density 3D-integration technology for multifunctional devices", (2009) IEEE International Conference on 3D System Integration, 3DIC 2009.
Marchal, P., et al., "3-D technology assessment: Path-finding the technology/design sweet-spot", (2009) Proceedings of the IEEE, 97 (1), pp. 96-107.
Xie, Y., et al., "Design space exploration for 3D architectures", (2006) ACM Journal on Emerging Technologies in Computing Systems, 2 (2), Apr. 2006, pp. 65-103.
Souri, S., et al., "Multiple Si layers ICs: motivation, performance analysis, and design Implications", (2000) Proceedings—Design Automation Conference, pp. 213-220.
Vinet, M., et.al., "3D monolithic integration: Technological challenges and electrical results", Microelectronic Engineering Apr. 2011 vol. 88, Issue 4, pp. 331-335.
Bobba, S. et al., "*CELONCEL: Effective Design Technique for 3-D Monolithic Integration targeting High Performance Integrated Circuits*", Asia pacific DAC 2011, paper 4A-4.
Choudhury, D., "3D Integration Technologies for Emerging Microsystems", IEEE Proceedings of the IMS 2010, pp. 1-4.
Lee, Y.-J., et al., "3D 65nm CMOS with 320° C. Microwave Dopant Activation", IEDM 2010, pp. 1-4.
Crnogorac, F., et al., "Semiconductor crystal islands for three-dimensional integration", J. Vac. Sci. Technol. B 28(6), Nov./Dec. 2010, pp. C6P53-C6P58.
Park, J.-H., et al., "N-Channel Germanium MOSFET Fabricated Below 360° C. by Cobalt-Induced Dopant Activation for Monolithic Three-Dimensional-ICs", IEEE Electron Device Letters, vol. 32, No. 3, Mar. 2011, pp. 234-236.
Jung, S.-M., et al., "Highly Area Efficient and Cost Effective Double Stacked S3( Stacked Single-crystal Si) Peripheral CMOS SSTFT and SRAM Cell Technology for 512M bit density SRAM", IEDM 2003, pp. 265-268.
Joyner, J.W., "Opportunities and Limitations of Three-dimensional Integration for Interconnect Design", PhD Thesis, Georgia Institute of Technology, Jul. 2003.
Choi, S.-J., "A Novel TFT with a Laterally Engineered Bandgap for of 3D Logic and Flash Memory", 2010 Symposium of VLSI Technology Digest, pp. 111-112.

(56) References Cited

OTHER PUBLICATIONS

Radu, I., et al., "Recent Developments of Cu-Cu non-thermo compression bonding for wafer-to-wafer 3D stacking", IEEE 3D Systems Integration Conference (3DIC), Nov. 16-18, 2010.
Gaudin, G., et al., "Low temperature direct wafer to wafer bonding for 3D integration", 3D Systems Integration Conference (3DIC), IEEE, 2010, Munich, Nov. 16-18, 2010, pp. 1-4.
Jung, S.-M., et al., ""Three Dimensionally Stacked NAND Flash Memory Technology Using Stacking Single Crystal Si Layers on ILD and TANOS Structure for Beyond 30nm Node"", IEDM 2006, Dec. 11-13, 2006.
Souri, S. J., "Interconnect Performance in 3-Dimensional Integrated Circuits", PhD Thesis, Stanford, Jul. 2003.
Uemoto, Y., et al., "A High-Performance Stacked-CMOS SRAM Cell by Solid Phase Growth Technique", Symposium on VLSI Technology, 2010, pp. 21-22.
Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.
Steen, S.E., et al., "Overlay as the key to drive wafer scale 3D integration", Microelectronic Engineering 84 (2007) 1412-1415.
Maeda, N., et al., "Development of Sub 10- μm Ultra-Thinning Technology using Device Wafers for 3D Manufacturing of Terabit Memory", 2010 Symposium on VLSI Technology Digest of Technical Papers, pp. 105-106.
Chan, M., et al., "3-Dimensional Integration for Interconnect Reduction in for Nano-CMOS Technologies", IEEE Tencon, Nov. 23, 2006, Hong Kong.
Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.
Naito, T., et al., "World's first monolithic 3D-FPGA with TFT SRAM over 90nm 9 layer Cu CMOS", 2010 Symposium on VLSI Technology Digest of Technical Papers, pp. 219-220.
Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.
Cong, J., et al., "Quantitative Studies of Impact of 3D IC Design on Repeater Usage", Proceedings of International VLSI/ULSI Multilevel Interconnection Conference, pp. 344-348, 2008.
Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.
Crnogorac, F., et al., "Nano-graphoepitaxy of semiconductors for 3D integration", Microelectronic Engineering 84 (2007) 891-894.
Koyanagi, M, "Different Approaches to 3D Chips", 3D IC Review, Stanford University, May 2005.
Koyanagi, M, "Three-Dimensional Integration Technology and Integrated Systems", ASPDAC 2009 presentation.
Koyanagi, M., et al., "Three-Dimensional Integration Technology and Integrated Systems", ASPDAC 2009, paper 4D-1, pp. 409-415.
Hayashi, Y., et al., "A New Three Dimensional IC Fabrication Technology Stacking Thin Film Dual-CMOS Layers", IEDM 1991, paper 25.6.1, pp. 657-660.
Clavelier, L., et al., "Engineered Substrates for Future More Moore and More Than Moore Integrated Devices", IEDM 2010, paper 2.6.1, pp. 42-45.
Kim, K., "From The Future Si Technology Perspective: Challenges and Opportunities", IEDM 2010, pp. 1.1.1-1.1.9.
Ababei, C., et al., "Exploring Potential Benefits of 3D FPGA Integration", in book by Becker, J.et al. Eds., "Field Programmable Logic 2004", LNCS 3203, pp. 874-880, 2004, Springer-Verlag Berlin Heidelberg.
Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.
Lin, M., et al., "Performance Benefits of Monolithically Stacked 3DFPGA", FPGA06, Feb. 22-24, 2006, Monterey, California, pp. 113-122.
Dong, C., et al., "Performance and Power Evaluation of a 3D CMOS/Nanomaterial Reconfigurable Architecture", ICCAD 2007, pp. 758-764.
Gojman, B., et al., "3D Nanowire-Based Programmable Logic", International Conference on Nano-Networks (Nanonets 2006), Sep. 14-16, 2006.
Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.
Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.
Rajendran, B., et al., "Thermal Simulation of laser Annealing for 3D Integration", Proceedings VMIC 2003.
Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.
Sadaka, M., et al., "Building Blocks for wafer level 3D integration",www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures? ," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.

(56) References Cited

OTHER PUBLICATIONS

Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et.al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol., No., pp. 562-567, Jun. 4-8, 2007.
Kuroda, T., "ThruChip Interface for Heterogeneous Chip Stacking," ElectroChemicalSociety Transactions, 50 (14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Phyisics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Kim, J., et al.; "A stacked memory device on logic 3D technology for ultra-high-density data storage"; Nanotechnology 22 (2011) 254006 (7pp).
Hsieh, P-Y, et al.."Monolithic 3D BEOL FinFET switch arrays using location-controlled-grain technique in voltage regulator with better FOM than 2D regulators", IEDM paper 3.1, pp. IEDM19-46 to IEDM19-49.
Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to IEDM19-405.
Rachmady, W., et al.,"300mm Heterogeneous 3D Integration of Record Performance Layer Transfer Germanium PMOS with Silicon NMOS for Low Power High Performance Logic Applications", IEDM 2019, paper 29.7, pp. IEDM19-697 to IEDM19-700.

\* cited by examiner

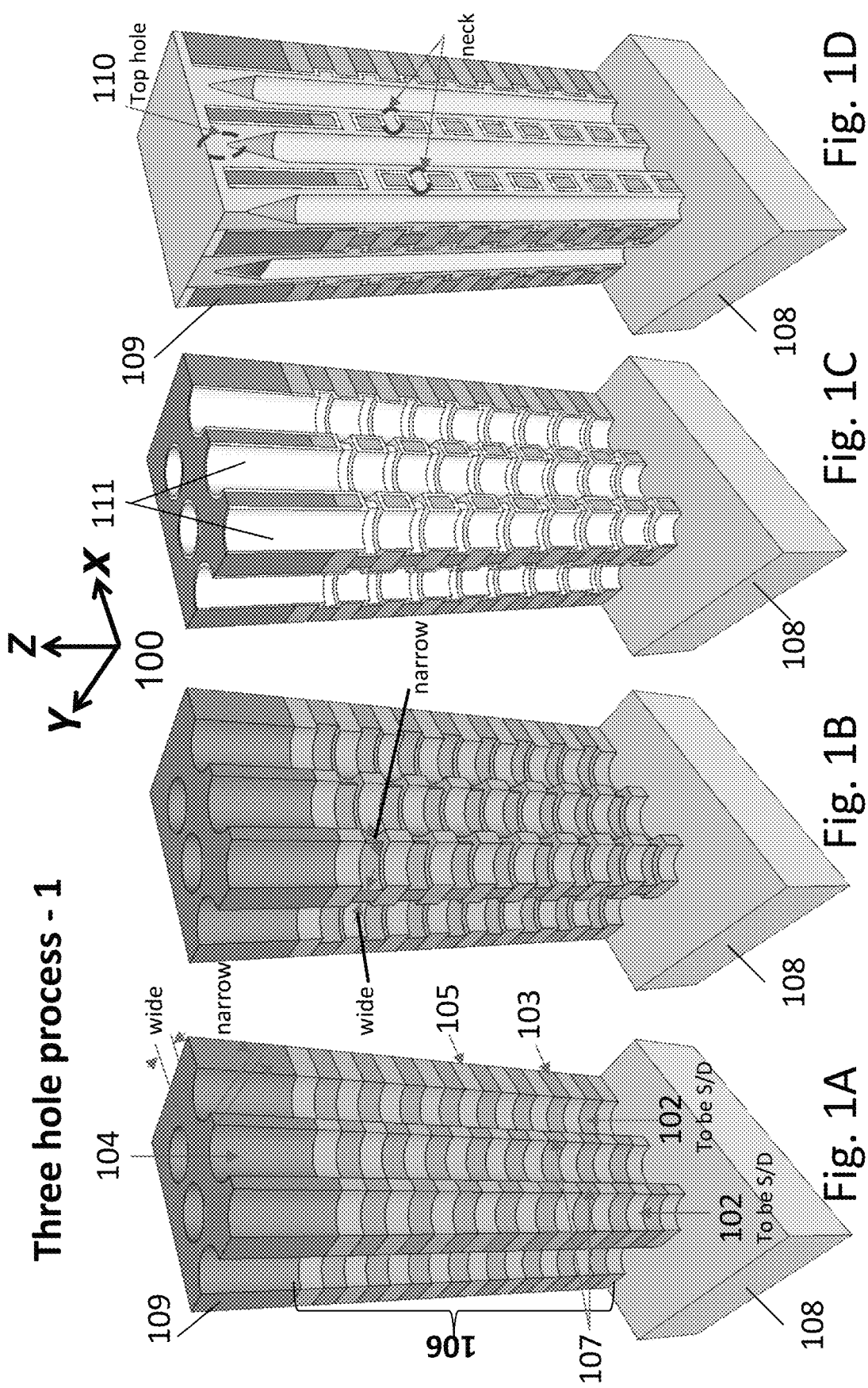

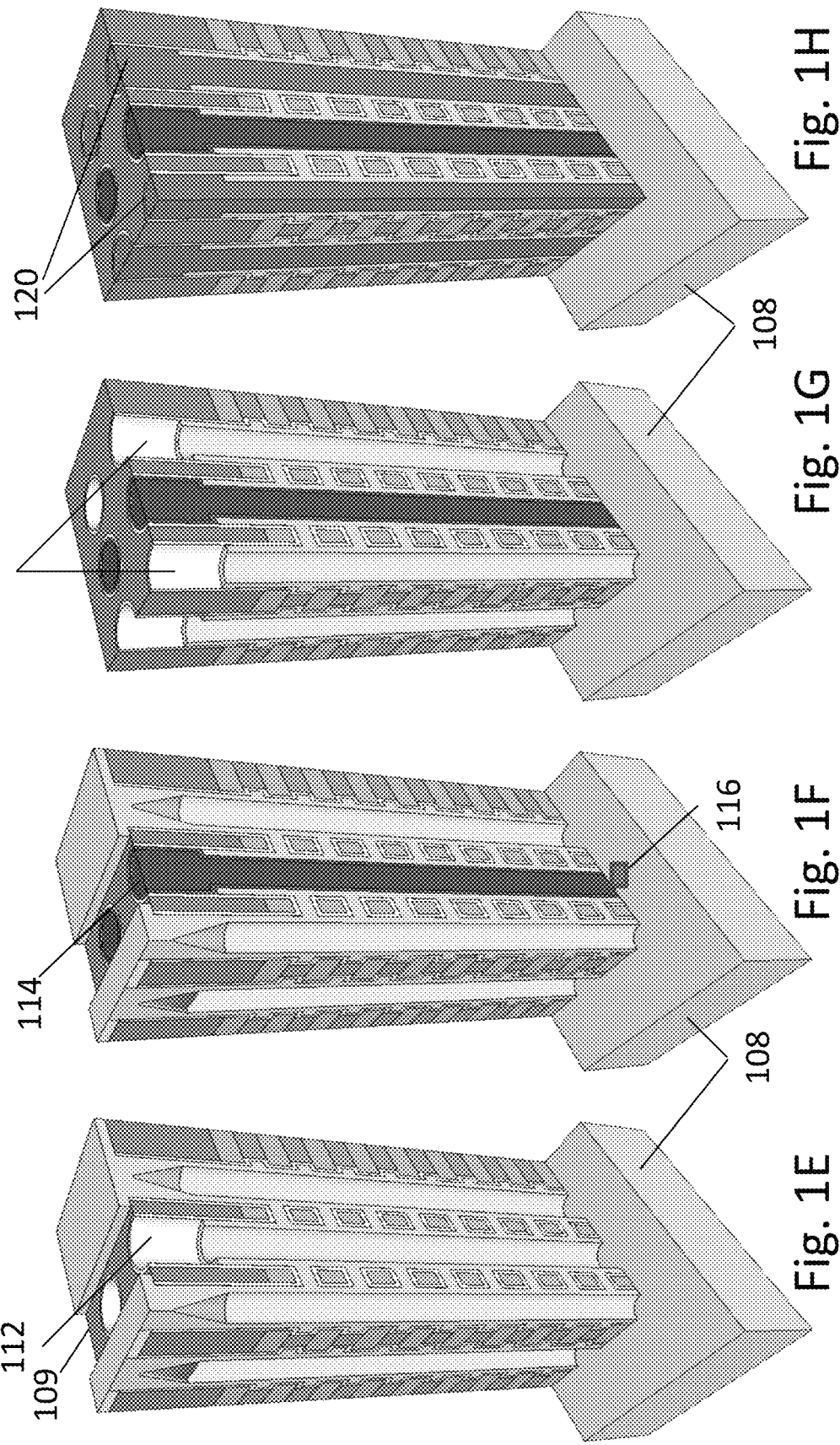

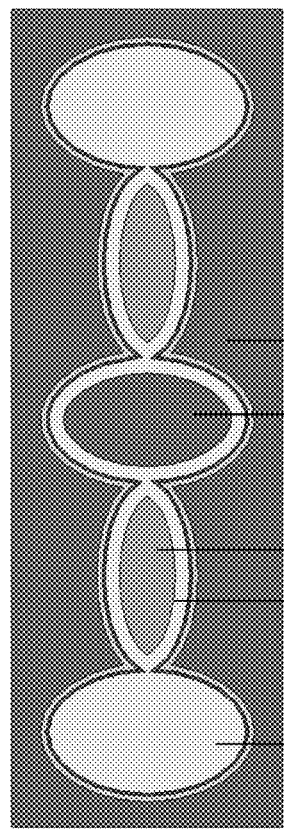
Fig. 1I
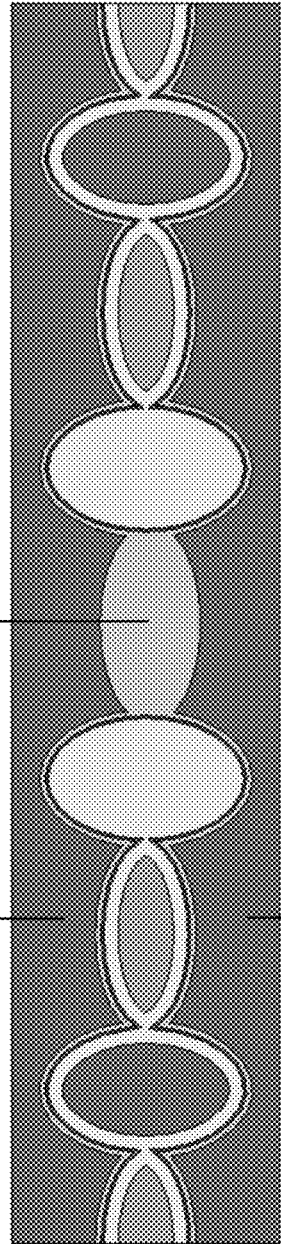
Fig. 1K
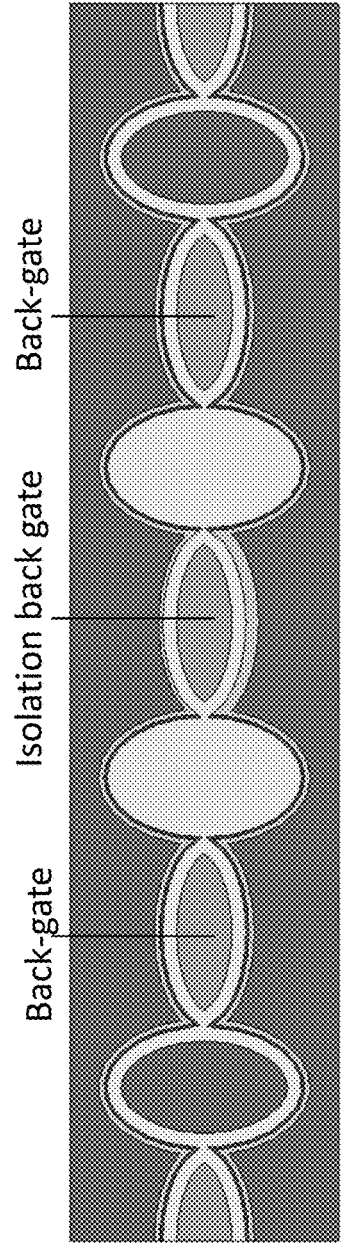
Fig. 1J
Fig. 1L

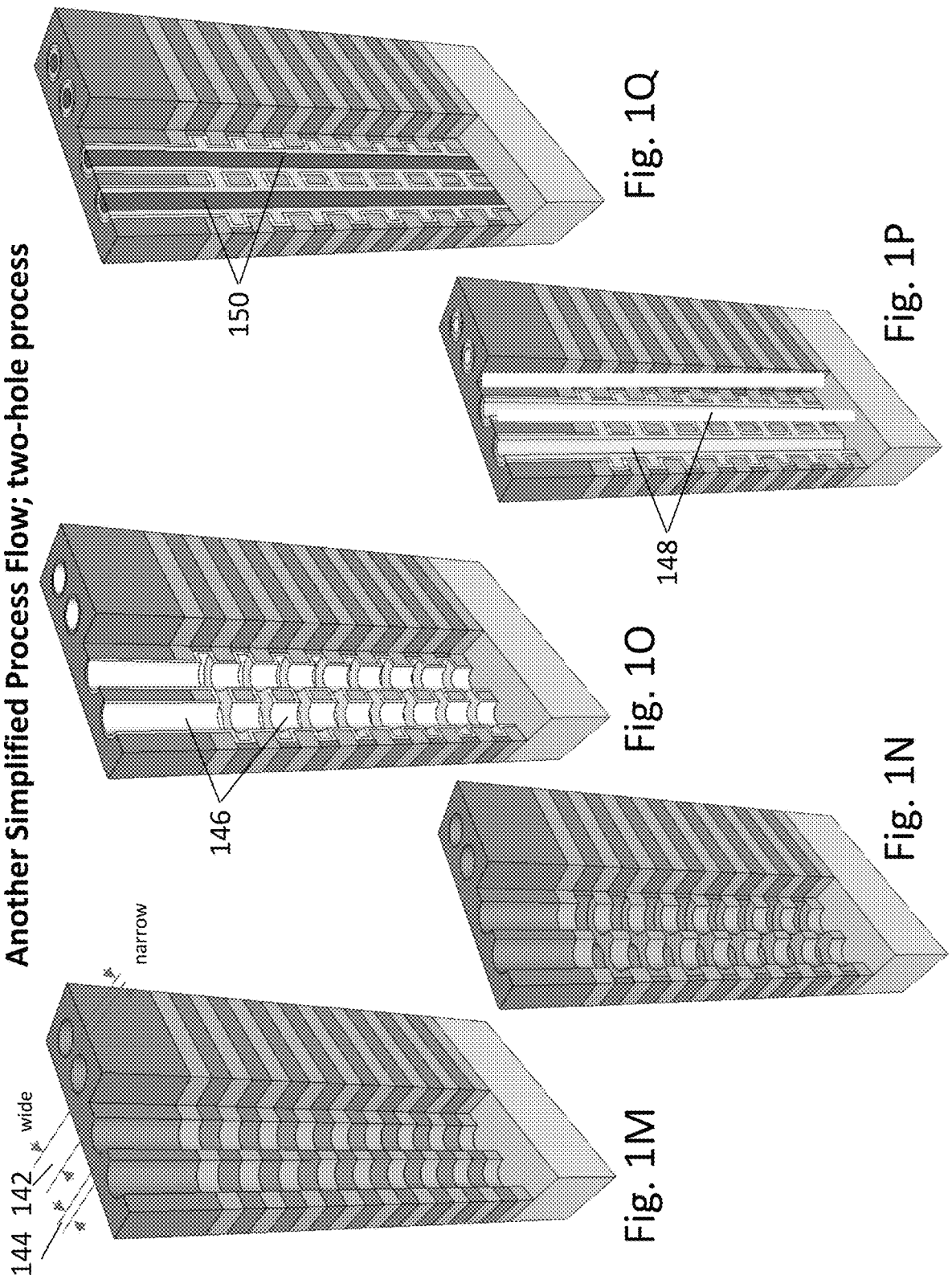

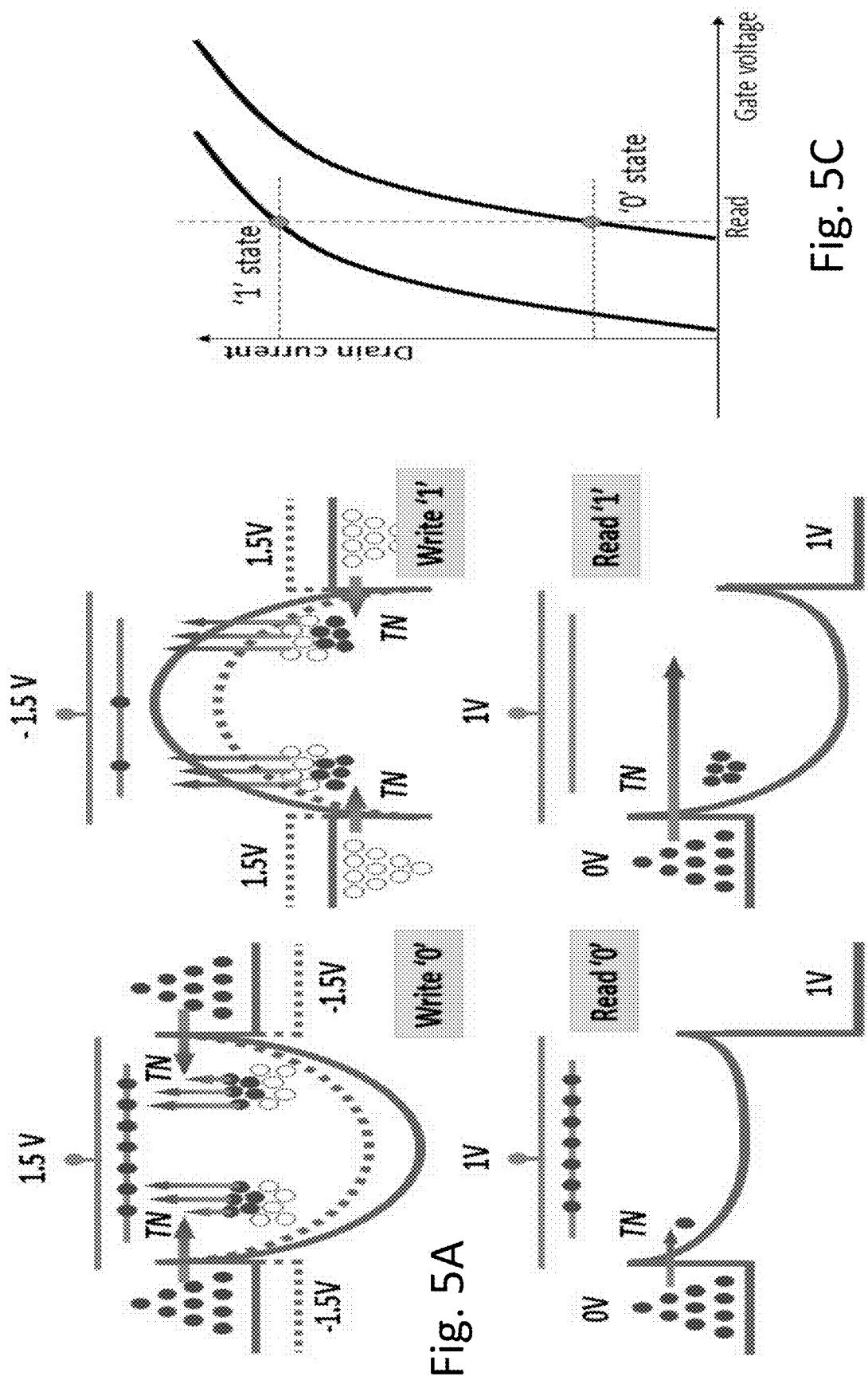

Novel Reference Current or Voltage

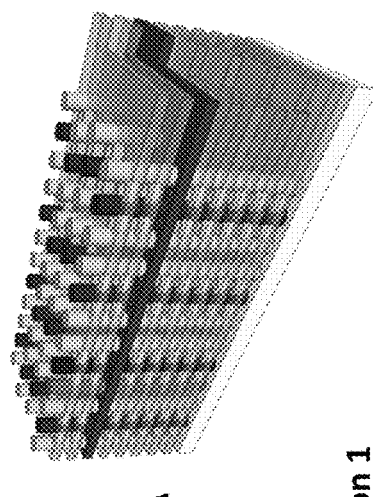
Fig. 9A
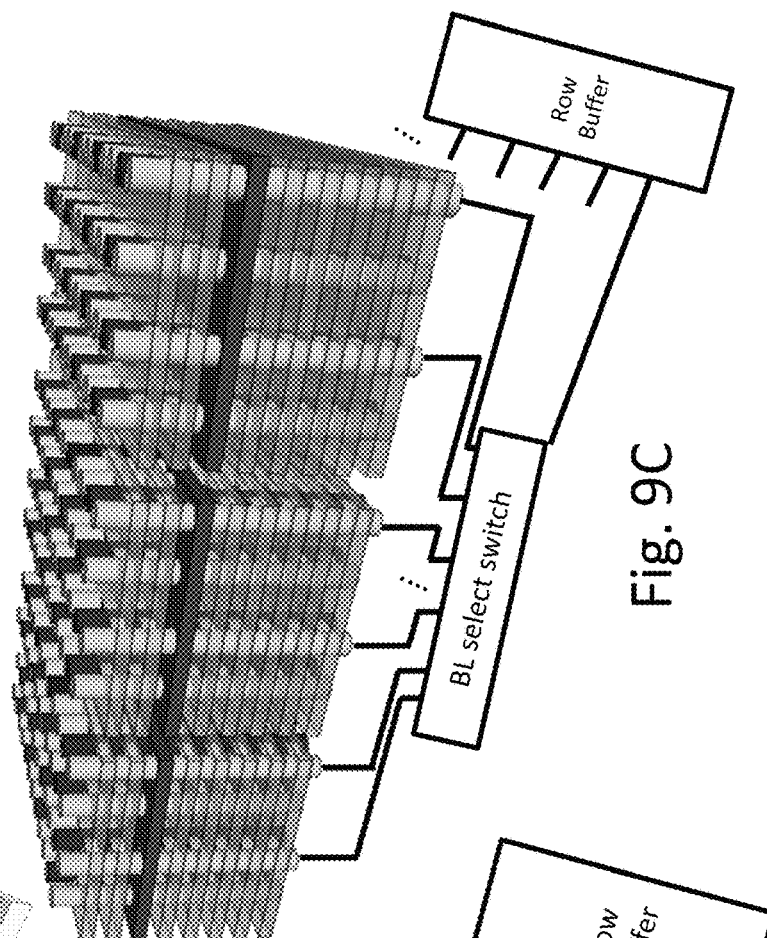
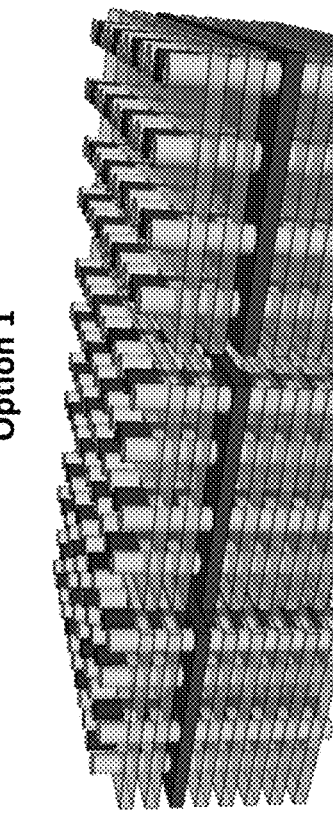
Fig. 9B
Fig. 9C

3D MEMORY SEMICONDUCTOR DEVICES AND STRUCTURES

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low and wire.

There are many techniques to construct 3D stacked integrated circuits or chips including:

Through-silicon via (TSV) technology: Multiple layers of dice are constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016; and U.S. patent application Publications and applications, Ser. Nos. 14/642,724, 15/150,395, 15/173,686, 16/337,665, 16/558,304, 16/649,660, 16/836,659, 17/151,867, 62/651,722; 62/681,249, 62/713,345, 62/770,751, 62/952,222, 62/824,288, 63/075,067, 63/091,307, 63/115,000, 2020/0013791, 16/558,304; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332(WO 2019/060798). The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, and 10,943,934. The entire contents of the foregoing patents, publications, and applications are incorporated herein by reference.

In addition, the entire contents of U.S. patents; U.S. Pat. Nos. 11,018,156, 10,892,016, 10,622,365, 10,297,599, 9,953,994; application Ser. Nos. 17/235,879, 63,091, 307, 63,075,067, 62/952,222, 62/897,364, 62/856,732, and 62/831,080 are incorporated herein by reference.

Additionally the 3D technology according to some embodiments of the invention may enable some very innovative IC devices alternatives with reduced development costs, novel and simpler process flows, increased yield, and other illustrative benefits.

SUMMARY

The invention relates to multilayer or Three Dimensional Integrated Circuit (3D IC) devices and fabrication methods. Important aspects of 3D IC are technologies that allow layer transfer. These technologies include technologies that support reuse of the donor wafer, and technologies that support fabrication of active devices on the transferred layer to be transferred with it.

In one aspect, a 3D memory device, the device including: a plurality of memory cells, where each of the plurality of memory cells includes at least one memory transistor, where each of the at least one memory transistor includes a source, a drain and a channel; a plurality of bit-line pillars, where each of the plurality of bit-line pillars is directly connected to a plurality of the source or the drain, where the bit-line pillars are vertically oriented, where the channel is horizontally oriented, and where the channel includes a circular shape or an ellipsoidal shape.

In another aspect, a 3D memory device, the device including: a plurality of memory cells, where each of the plurality of memory cells includes at least one memory transistor, where each of the at least one memory transistor includes a source, a drain and a channel; a plurality of bit-line pillars, where each of the plurality of bit-line pillars is directly connected to a plurality of the source or the drain, where the bit-line pillars are vertically oriented, and where the channel is horizontally oriented and includes a channel width longer than 5 nm and shorter than 25 nm.

And in another aspect, a 3D memory device, the device including: a plurality of memory cells, where each of the plurality of memory cells includes at least one memory transistor, where each of the at least one memory transistor includes a source, a drain and a channel; a plurality of bit-line pillars, where each of the plurality of bit-line pillars is directly connected to a plurality of the source or the drain, where the bit-line pillars are vertically oriented, where at least one of the plurality of the memory cells include a tunneling oxide thinner than 1 nm, and where at least one of the plurality of the memory cells include a tunneling oxide thicker than 3 nm.

And in another aspect, a 3D memory device, the device including: a plurality of memory cells, where each of the plurality of memory cells includes at least one memory transistor, where each of the at least one memory transistor includes a source and a drain; a plurality of bit-line pillars, where each of the plurality of bit-line pillars is directly connected to a plurality of the source or the drain, where each of the plurality of bit-line pillars includes metal atoms such that the plurality of bit-line pillars have at least partial metallic properties; and a thermal path from the bit-line pillars to an external surface of the device to remove heat.

And in another aspect, a 3D memory device, the device including: a plurality of memory cells, where each of the plurality of memory cells includes at least one memory transistor, where each of the at least one memory transistor includes a source and a drain; a plurality of bit-line pillars, where each of the bit-line pillars is directly connected to a plurality of the source or the drain; and a thermal path from the bit-line pillars to an external surface of the device to remove heat.

And in another aspect, a 3D memory device, the device including: a plurality of memory cells, where each of the plurality of memory cells includes at least one memory transistor, where each of the at least one memory transistor includes a source, a channel and a drain; and a plurality of bit-line pillars, where each of the bit-line pillars is directly connected to a plurality of the sources or drains, where the channel includes crystallized polysilicon, and where the crystallized polysilicon has been crystallized from a heat sourced from the source or drain of the channel.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, where the channel is horizontally oriented, and where the channel is isolated from another channel disposed directly above the channel.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, and where the plurality of memory cells include a partially or fully metalized source, and/or a partially or fully metalized drain.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, and where the channel includes crystallized polysilicon.

BRIEF DESCRIPTION OF THE DRAWINGS

Various embodiments of the invention will be understood and appreciated more fully from the following detailed description, taken in conjunction with the drawings in which:

FIGS. 1A-1H are exemplary illustrations of some of the process steps to form a 3D NOR structure;

FIGS. 1I-1L are exemplary illustrations via a planar view of a 3D NOR structure;

FIGS. 1M-1Q are exemplary illustrations of alternative process steps to form a 3D NOR structure;

FIGS. 5A and 5B are exemplary illustrations of a memory cell write and read operation scheme;

FIG. 5C is an exemplary illustration of a programmed and erased memory cell Id-Vg characteristics;

FIGS. 9A-9C are exemplary illustrations of array options with SL/BL select transistors under the 3D-NOR memory array.

DETAILED DESCRIPTION

Figure 3B:
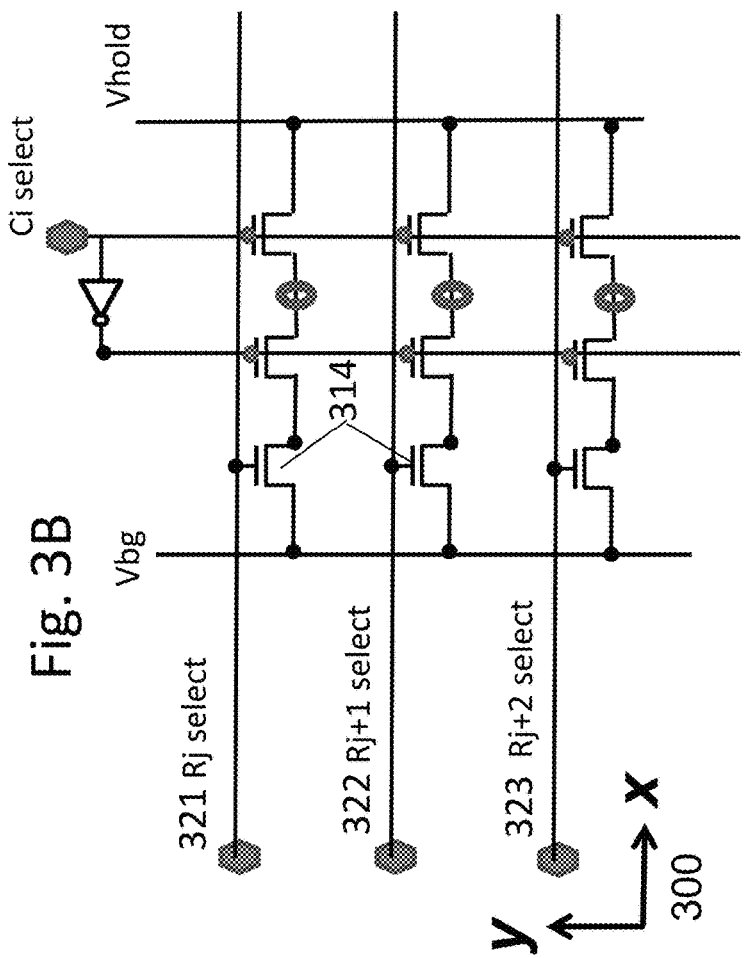
FIGS. 3A-3B are examples of back-gate bias control schemes.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by any appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

The use of layer transfer in the construction of a 3D IC based system could enable heterogeneous integration wherein each strata/layer/level may include, for example, one or more of MEMS sensor, image sensor, CMOS SoC, volatile memory such as DRAM and SRAM, persistent memory, and non-volatile memory such as Flash, RRAM, FRAM, HRAM, MRAM, and OTP. Such could include adding memory control circuits, also known as peripheral circuits, on top or below a memory array. The memory strata may contain only memory cells but not control logic, thus the control logic may be included on a separate stratum. Alternatively, the memory strata may contain memory cells and simple control logic where the control logic on that stratum may include at least one of decoder, buffer memory, sense amplifier. The circuits may include the charge pumps and high voltage transistors, which could be made on a strata using silicon transistors or other transistor types (such as SiGe, Ge, CNT, etc.) using a manufacturing process line that may be, and often is, different than the low voltage control circuit manufacturing process line. The analog circuits, such as for the sense amplifiers, and other sensitive linear circuits could also be processed independently and be transferred over to the 3D fabric. Such 3D construction could include "Smart Alignment" techniques presented in this invention or incorporated references, or leverage the repeating nature of the memory array to reduce the impact of the wafer bonder misalignment on the effectiveness of the integration; such as is presented in at least PCT/US2017/052359 (WO2018/071143), incorporated herein by reference in its entirety, particularly in respect to its FIG. 11A to FIG. 12J, or using hybrid bonding techniques as presented in respect to its FIG. 20A to FIG. 25J.

More specifically, at least within PCT/US2018/016759, published as WO2018/144957, various 3D memory structures are presented including a structure named 3D NOR-P such as in respect to at least FIGS. 11A-22D, and FIGS. 27A-34C, and enhancements as presented in at least PCT/US2018/52332, published as WO 2019/060798, such as in respect to FIGS. 9A-13A, and FIGS. 14A-18, all of the foregoing is incorporated herein by reference in its entirety. Much of the following are further variations, enhancements, and detailed alternatives for such a 3D NOR-P memory structure, device and manufacturing methods.

An alternative process flow for such a 3D NOR-P structure is presented in reference to FIGS. 1A-1H. These are 3D illustrations along X-Y-Z direction 100, in which X-Y directions are along the plane of the wafer and Z direction is perpendicular to the wafer front/top surface. The 3D NOR-P structure can be hereinafter cited as 3D memory array or 3D array, interchangeably. The base structure starts with a preprocessed wafer including foundation structure 108, which sometimes is referenced as periphery under cell ("PUC") or cell over periphery ("COP"). The foundation structure 108 could include various circuits, for example, such as decoder, sense amplifier, data buffer, address buffer, interconnect matrices/structures with or without antifuses, I/O buffers, ESD, and bonding pad structures. The 3D-NOR structure may be sequentially processed on top of the base structure 108 or a 3D-NOR structure maybe fabricated separately and then bonded into the base structure later. Multilayer alternating silicon dioxide and highly doped polysilicon or alternating silicon dioxide and silicon nitride to be later replaced with metal gate are successively deposited (or epitaxially grown in some cases) forming stack pairs. The common layers are silicon dioxide 103 often called oxide and poly-silicon 105 often called poly. In some common 3D NAND structures, the successive deposition of silicon nitride (in place of poly-silicon 105) is often shortened to nitride. In the 3D NOR-P structures, just as in 3D NAND structures, the polysilicon 103 could be heavily doped such as n++-type or p++-type and could be used as the gates for the transistors of which plane formed by etching holes (often called "punch") in the multilayer structure. The holes drawn throughout this invention may be drawn circular; however, the holes are not necessarily circular; rather, for example, they can be a square, a square with its corners softened ('champhered'), or ellipsoidal or some combination thereof. The gates may also function as the Word-lines ("WL") of the 3D memory. Herein, these WLs will be drawn along the X direction, which controls one row of the arrayed in multiple column channels along the X direction. Alternatively, these WLs will be in the XY plane, which controls multiple columns and rows of the arrayed channels in the XY plane. Other orientations may be possible due to engineering design, process, economics, performance, etc. considerations.

FIG. 1A illustrates a multilayer 106 structure formed over foundation structure 108 covered with patterned hard-mask 109 after holes 102, 104 been etched through. The holes may be punched as an array with 'columns' along the X direction and 'rows' along the Y direction. A single memory cell may consist of three punched holes. The diameter of these holes 102, 104 may be the same or different. The holes 102 could be designated for the Source/Drain ("S/D") function and the holes 104 could be designated for the nano device Channel function. The space between S/D hole 102 and Channel hole 104 should be designed small enough so in the following step of indenting the polysilicon 103 layer from the hole side, the polysilicon in-between holes in the X direction would be fully removed, as is illustrated in FIG. 28A of PCT/US2018/016759 (WO2018144957). The region(s) where S/D hole 102 and Channel hole 104 merge is hereinafter referred as the neck region 107. However, the space between rows could be formed to be relatively wide so that the holes along Y direction are not merged and as the remaining polysilicon layer makes conductive along the X direction it could be used to form the Word-Lines. After such a lateral selective polysilicon etch, the formed neck region may be sharp. A process smoothing the corners of the neck region such as heat treatment may optionally be added. Within a row the holes could have a relatively narrow gap. The number of pairs in the stack could be below about 10 such as 4 or 8 layers, or below about 100 such as 32, 64, or 96 layers, or over about 100 such as 128 or 156 layers. Advanced 3D NAND products have now about 128 pairs. The diameter of the holes could be about 10 nm or about 20 nm or about 40 nm or about 60 nm or even larger.

FIG. 1B illustrates the structure after selective isotropic polysilicon 103 layer etch without removing oxide layer 105, indenting the polysilicon layers from within the holes, horizontally removing it between the S/D holes and the channel holes. While the WL could be narrowed a bit, the WLs in along X direction in between holes in the Y direction are continuous and their integrity and functionality could be kept.

FIG. 1C illustrates the structure after conformal deposition of a charge storage layer 111, which may include a combination of blocking oxide, tunneling oxide, and there between a charge trap layer or floating gate. Alternatively, instead of the charge storage layer, a ferroelectric layer such as HfZrO or HfSiO may be used as a gate dielectric and the 3D NOR structure may be operated according to the ferroelectric random access memory (FRAM) mechanism.

FIG. 1D illustrates the structure after conformal deposition of channel material such as undoped or lightly doped polysilicon, followed by a non-conformal deposition of either the same channel material or other 'dedicated' material that can seal the hole opening region 110 near the hard mask 109 without contaminating the channel material. For simplicity and clarity, the channel material hereinafter will assume to be polycrystalline silicon. When the same channel material could be used for sealing, as the channel material is being deposited, the channel material can fill the neck region, thereby separating the merged hole into three respective holes, two S/D holes 102 and one channel 104 hole. When a different 'dedicated' material and process is used for sealing, a low step coverage deposition process such as sputtering or non-conformal chemical vapor deposition (CVD) can be used to seal the structure. To maximize the non-conformality, a wafer may be tilted during deposition, often referred as glancing angle deposition. The channel material could alternatively be, for example, polycrystalline silicon-germanium, polysilicon germanium, or amorphous silicon, amorphous silicon-germanium, amorphous germanium, which could be undoped or lightly doped, for example, not exceeding a doping concentration of about $1 \times 10^{19}/cm^3$. A process to further crystallize the polysilicon channel such as laser annealing or alternative annealing step which avoids excessive dopant diffusion may be added. For example, the blocking oxide thickness could be about 3-10 nm, the charge trap layer or floating gate thickness could be about 3-8 nm, the thin tunneling oxide thickness could be about 0-5 nm, and the channel polysilicon thickness could be about 5-30 nm.

The exemplary process steps from FIG. 1E to FIG. 1G illustrate the formation of a back-gate for enhancing functionalities, for example, such as, improved retention time, write/erase speed, power efficiency, and disturb immunity. These steps may be skipped if no back-gate is desired. For example, the portion for the back-gate illustrated hereinafter may remain as a void or may be fully filled with, for example, a bulk polysilicon channel. FIG. 1E illustrates the structure after selectively opening the channel holes 112 by etching the seal region near the hard mask layer 109. During this opening process, the etching should be controlled carefully in order not to damage the channel material.

FIG. 1F illustrates the structure after filling the back-gate oxide, for example, such as silicon dioxide and the back-gate, for example, such as highly doped polysilicon or metal gate, inside the channel holes 112. If desired, the back-gate 114 oxide may be a stack of blocking oxide, tunneling oxide, and there between a charge trap layer or floating gate. Alternatively, the back-gate may be a direct body contact with no back-gate oxide. In this case, the back-gate may be heavily doped polysilicon with the same doping type as the transistor channel. Prior to the back-gate process, a process of opening a contact at the bottom of the hole 104 for the back-gate to be linked to the foundation structure 108 carrying the back-gate control circuits 116 could be included.

FIG. 1G illustrates the structure after opening the S/D holes 118, whose process is similar to the process explained with respect to FIG. 1E.

FIG. 1H illustrates the 3D NOR-P intermediate structure after filling S/D 120 with material. For example, the S/D material could form a pillar of N+ poly, or an N+ polysilicon pillar with a metal core followed by activation and silicidation, or a full metal pillar. The metal may be at least one of Ni, Ti, Co, Pt, Al, or other similar Si reactive materials. Or Si non-reactive but conductive, such as W or Ag. In one embodiment of this invention, the source and the drain are not symmetric. For example, one of the sources and one of the drains can be metal or metal silicide and the other of the source and the drain are non-metal or non-silicide material as illustrated in XY plane view FIG. 1I of FIG. 1H or a slightly modified FIG. 1H. This asymmetric S/D structure maybe desired for minimizing ambipolar transfer characteristics, which in some cases could increase the off-state leakage current. Prior to the S/D process, a process opening a contact at the bottom of each of S/D holes 102 for the S/D to be linked to the foundation structure 108 carrying the S/D control circuits could be included. Additionally, the processes sequences between S/D formation and back-gate formation could be interchangeable depending on engineering, design, and technology choices and optimizations.

In another embodiment, one source may be shared with at least two adjacent channels and drains as illustrated in XY plane view of FIG. 1J. In a further embodiment, the unit pillar cells along the X-direction may be electrically isolated by isolation oxide as illustrated in FIG. 1K or isolated by chaining source and drains as illustrated in FIG. 1L. By doing so, north and south sides of one channel can be independently controlled respectively by north WL and south WL. When the unit pillar cell isolation is conducted in the structure of FIG. 1L, the back-gate placed in-between adjacent unit pillars may be referred to as an 'isolation back-gate', which are dedicated to stop inter-pillar leakage current. In one embodiment of the 3D memory chip, a periphery circuit layer can be placed under or over of the 3D memory array while the interconnection lines between the periphery and the array can be made both to top and bottom of the memory array. In another alternative the periphery circuits could be on both sides under the 3D array and over the 3D array.

FIGS. 1M-1Q illustrate an alternative process without dedicated punch holes for the channel pillars, both structure and process flow. FIG. 1M illustrates punch holes for a pair of Source/Drains (S/D) at a separation distance of narrower space 144 with wider space 142 the separation distance to the holes of the next pair. FIG. 1N illustrates the structure after an isotropic polysilicon etch. The isotropic polysilicon etch is used to create a horizontal indentation of the polysilicon until the polysilicon of the narrow gap 144 between the S/D pillars is fully removed but the polysilicon in the wider gap 142 between pairs of S/D remains FIG. 1O illustrates the structure after conformal deposition of a charge trap layer stack (O/N/O) 146 or floating gate stack throughout the punch holes. FIG. 1P illustrates the structure after a conformal polysilicon deposition forms polysilicon channels 148 filling up the narrow gaps 144 in-between the S/D pairs. The holes could be designed to be wide enough so completely filling the narrow gaps 144 would not completely fill the holes, leaving room for an optional etch to widen the inner tube of the holes. As illustrated in FIG. 1Q, the S/D holes could be filled with N+ doped polysilicon, or metal, or combination of N+ doped polysilicon and metal, or their silicide as discussed previously for S/D pillars, thus S/D pillars 150 may be formed.

According to one embodiment of this invention, a process step for Metal Induced Lateral Crystallization ("MILC") of polysilicon channel could be applied in 3D NOR-P process. The MILC process is presented in at least a paper by Lee, Seok-Woon, and Seung-Ki Joo. "Low temperature poly-Si thin-film transistor fabrication by metal-induced lateral crystallization." *IEEE Electron Device Letters* 17.4 (1996): 160-162, incorporated herein by reference. In some literatures, the MILC process is also referred as metal induced recrystallization (MIC) as the recrystallization direction is not always lateral. The similar recrystallization process is applied in polysilicon channel 3D NAND structure as presented in U.S. Pat. No. 8,445,347 B2, incorporated herein by reference. A time required for MIC process in 3D NAND channel usually takes a few hours as the length of the channel is often greater than 5 µm. However, a time required for MIC process in 3D NOR-P channel can be less than one hour as the length of the channel would not be exceeding 0.2 µm. The process step for MIC in 3D NOR-P may be added in between the steps related to FIG. 1G and FIG. 1H or between FIG. 1P and FIG. 1Q. When at least one side holes designed for the source or the drain are opened, a recrystallization metal seed or nucleation promoter such as nickel, palladium, aluminum, or their combination is conformally deposited. Then, the recrystallization may be conducted by a subsequent low temperature annealing ranging from 300 to 600° C. The amorphous or small grain polysilicon channel can be converted to a large grain polysilicon channel or even single crystalline channel. The results of channel recrystallization are an increase of carrier mobility, an increase of the cell current, improvement of cell variability, tightening of the cell threshold voltage distribution, and improvement of retention time. The MILC process could be initiated from just one side of the channel to reduce the formation of boundaries associated from two crystallization waves meeting if such been initiated from both sides.

Figure 2:
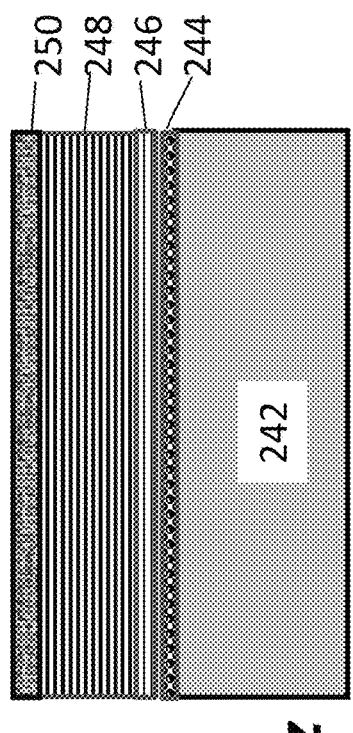
FIG. 2 is example of periphery under and periphery over a 3D NOR structure.

FIG. 2 illustrates a cut view along X/Y and Z 200 direction of a section of a 3D NOR-P structure. This embodiment offers periphery sandwiching on both sides, under as well as over, the 3D memory array structure. In one example, the periphery under the cell memory control circuits 246 may control S/D and WLs while the periphery over the cell 250 may control back-gates, or vice versa, or a shared combination. A 3D NOR-P structure may include a base wafer 242, an optional 'cut-layer' 244, memory control circuits 246 disposed under the 3D NOR memory array 248, and overlaying control circuit 250. Memory control circuits 246 could be used to control the back-gate while overlaying control circuit 250 could be used to control the S/D pillars.

The formation of a multi-level 3D structure could utilize any of the techniques presented in the incorporated art such as at least PCT/US2017/052359, incorporated herein by reference, such as had been presented in reference to its FIGS. 11F-11K, FIGS. 12F-12J, or FIG. 21A to FIG. 25J. Some of levels could be integrated using Hybrid Bonding and some could be integrated using other type of bonding followed by forming the connectivity.

Figure 3A:
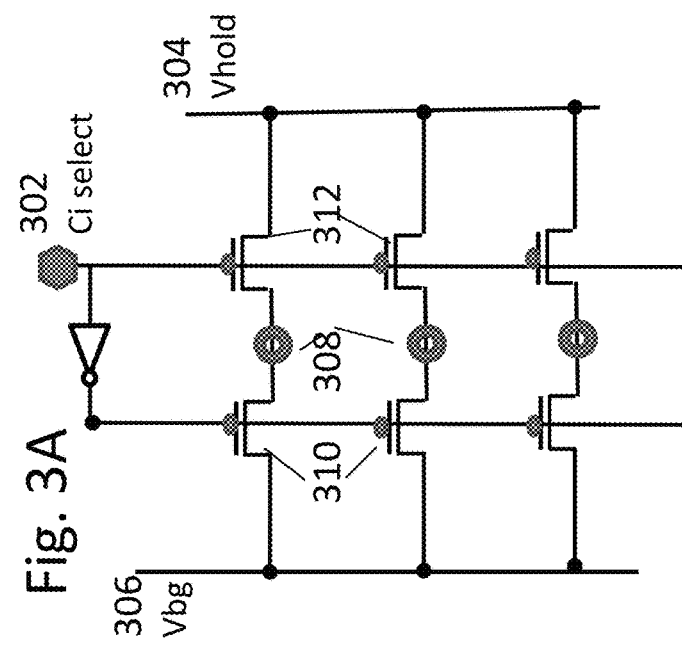

FIGS. 3A-3B are two exemplary circuit schematic illustrations of a section of the Back-Gate control circuit which may reside in foundation structure 108 along the X-Y 300 direction.

FIG. 3A illustrates a control per column circuit (along Y direction) in foundation structure 108 for back-bias pillars 308 of a 3D memory array. A control line, Ci or Column 'i' Select 302 allows switching a column of Back-Bias pillar or back-gate voltage (Vbg) being fed by between Holding voltage 304 using transistors 312, to access back-bias voltage 306 using transistors 310. The holding voltage is designed for extending the data retention time of the memory during standby. The holding voltage will be chosen depending on the characteristics of the memory cell. For example, when the loss of electrons in the charge trap layer of a programmed cell is due to disturb conditions or standby is stronger than the accidental injection of electrons to the charge trap layer of the erased cell, the negative holding voltage to the back-gate may suppress the electron loss because the electric field pushes the electrons toward the WL. Inversely, if the accidental charge injection to the charge trap layer of an erased cell is due to disturb conditions or standby is stronger than the loss of electrons in the written state, a positive holding voltage to the back-gate may be used. In addition, the back-gate column in which a cell is being accessed will have the back-bias voltage Vbg according to the design read or write back-bias voltage. A positive back-gate voltage may be used to remove the stored electrons or erase the cell. A positive back-gate voltage but the same or smaller than the positive back-gate voltage used for the erase may be used to read the cell, which amplifies the read current and reduces the read time by a double-gating manner. A negative back-gate voltage may be used to push the electrons to be stored or program the cell. A negative back-gate voltage but the same or smaller than the negative back-gate voltage used for the programming may be used to bias all the other unselected cells, which suppresses the overall leakage current.

FIG. 3B illustrates an alternative control per column circuit in foundation structure 108 with an additional transistor 314 which allows an additional per-row control 321, 322, 323 for the selected column. The cells other than the selected row would have their back-bias floated while the one cell of the selected row (Rj Select active) would be a potential Vbg. Such an additional per row selection could help reduce the probability for read/write disturb (reading or writing of an unselected cell).

Figure 4B:
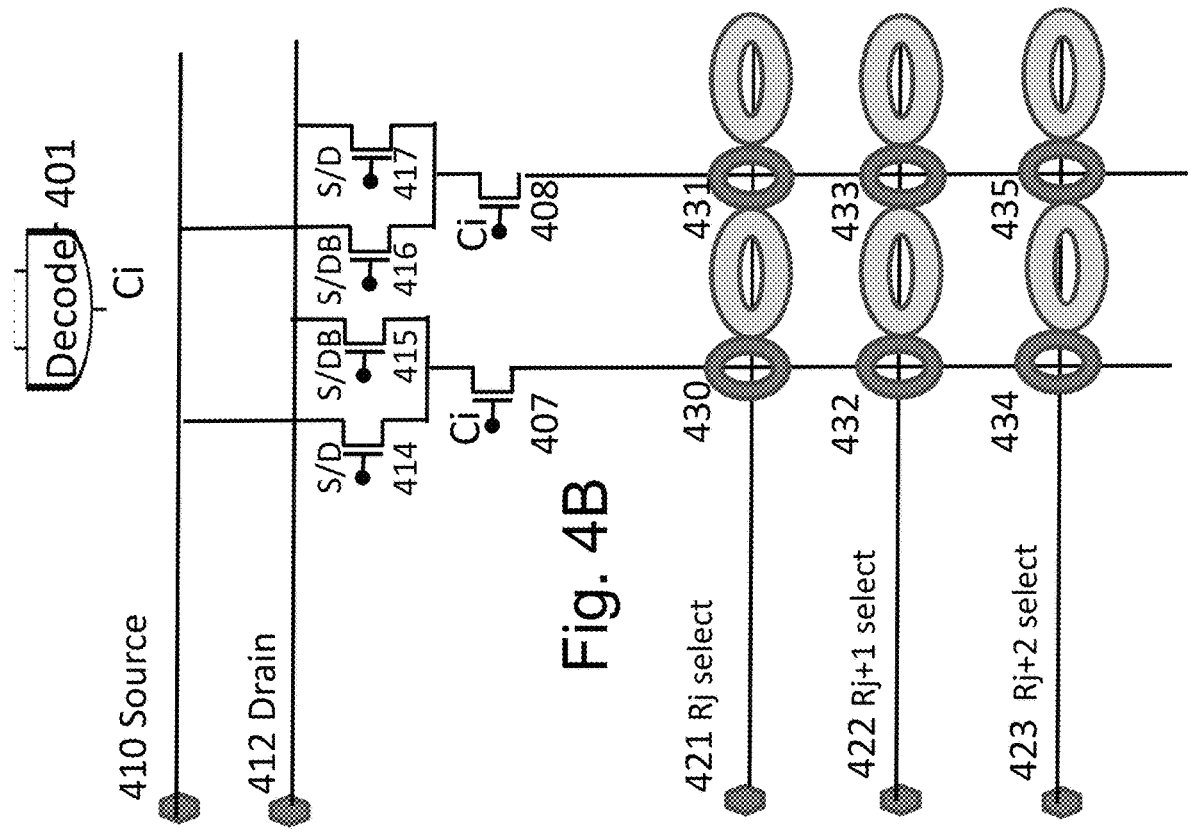
FIG. 4B is an additional example of a back-gate bias control scheme.
Figure 4A:
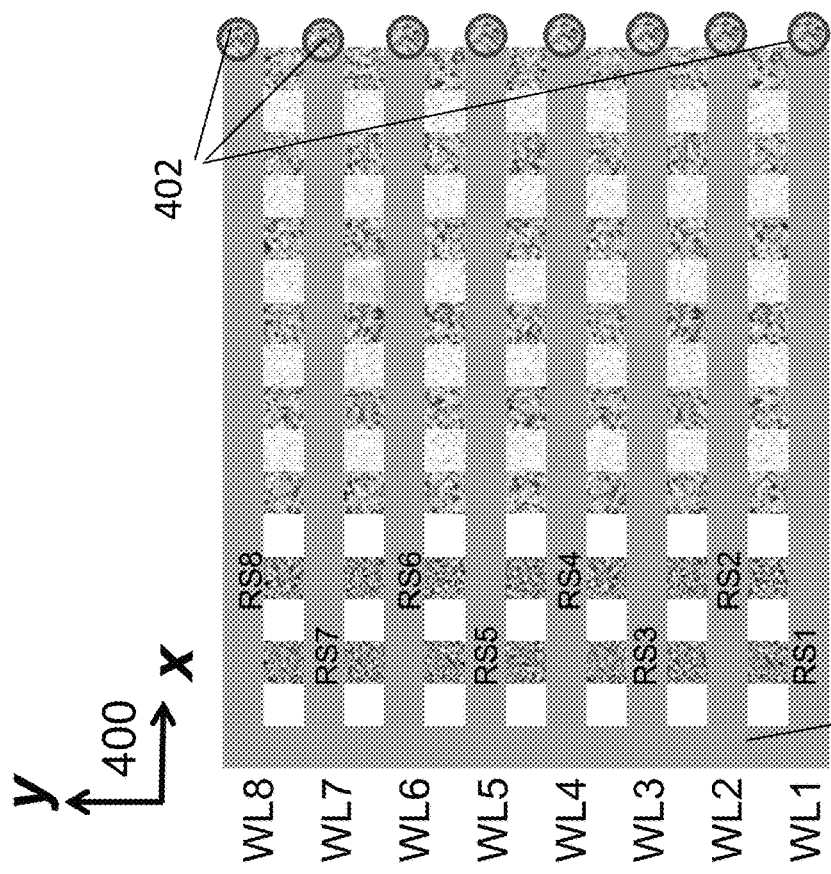
FIG. 4A is an example of a word line select structure.

FIG. 4A is an alternative configuration to FIG. 13A of PCT/US2018/052332 (WO 2019/060798). It illustrates an X-Y 400 cut of a 3D NOR-P structure. The Word-Lines (WL1, WL2 . . . ) between rows of memory cells are oriented in the X direction. WLs from WL1 to WL8 are one body at the edge of the 3D unit block so that they supposed to receive a common wordline voltage. Each Word-Line (WL1-WL8) has respective per row WL select transistors RS1-RS8 (also called ridge-select) so that only selected WL through a selected RS transistor receives the wordline control voltage while remainder of the unselected WLs are floating. Optionally, on the other side a complementary structure could provide a ('weak') pull down pillar connection 402 for the unselected word-lines. At each level the word-lines have a common Y connection strip 404 to allow a Y oriented stair-case for the per-level contacts.

FIG. 4B illustrates an alternative control per column circuit in the overlaying periphery structure 250. The circuit illustration is aligned in an X-Y 400 view per one column i having an activated decoded 401 column control signal Ci. There may be two global control signals; Source signal 410 and Drain signal 412. For the activated column I one of these signals will be transferred to the left side S/D contact (430, 432, 434, . . . ) and the other will be connected to right side S/D contact (431, 433, 435, . . . ). The choice which side receives the Source 410 signal and which the Drain 412 signal is control by the logic signal S/D and its inversion S/DB using the selector circuit of the four transistors 414, 415, 416, 417. And for a Ci signal this selection would be wired through the enabling transistors 407, 408 to the two relevant S/D columns A row selection signal Rj Select (421, 422, 423, . . . ) could be used to enable these signals to the specific selected row S/D pillars through a vertical transistor (not shown) at the top of the S/D pillars.

Embodiments of the present invention are a 3D NOR-P device and its array that sense data using voltage sensing process with a voltage sense amplifier. The voltage sensing process determines the stored memory state by pre-charging a same voltage into a selected bit line to be read and a reference bit line coupled to a reference. The reference bit line may be a fixed voltage supplied from a periphery circuit or the reference bit line may be bit line different from a selected bit line, namely an unselected bit line. The pre-charged voltage levels on the selected bit line and reference bit line asymmetrically shifts by flowing a different level of current through to the selected bit line and reference bit line depending on the threshold voltage of the programmed or erased state of the selected memory cell. The developed potential difference between the selected bit line and reference bit line is then sensed by a coupled voltage sense amplifier. When the selected cell is at the erased state or low threshold voltage state, a drive current flows through the source line and bit line of the memory cell and thus the selected voltage falls fast relative to that of the reference cell. When the selected cell is at programmed state or high threshold voltage state, a subthreshold leakage level current or no current flows through the source line and bit line of the memory cell and thus the selected voltage falls slowly or is stable relative to that of the reference cell. These allow a fast differential voltage sense amplifier to sense data and verify operation.

In one embodiment, the reference bit line can be a bit line in a paired unit or mat or bank that is associated with the unit or mat or bank being accessed. Or the reference bit line can be a bit line reserved and dedicated as the reference cells where all memory cells associated with the reference bit line are at high threshold voltage.

In a charge trapped memory transistor formed, as an example, with an n+ doped source and n+ doped drain, Fowler-Nordheim (FN) tunneling is inherently slow for DRAM replacement or even storage class applications. For example, the write speed using FN tunneling is greater than an order of few microseconds. On the other hand, the writing speed using hot carrier can offer faster speed, shorter than a microsecond, which is faster than FN tunneling. Nevertheless, the write speed near a microsecond is not applicable for DRAM applications. In order to generate hot electrons in the charge trapping memory using n+ doped source and n+ doped drain, the source is grounded and a high positive voltage is applied to the drain and the gate. At this condition, the electrons injected from the source are accelerated and become energetic near the drain junction. The majority of the electrons are swept into the drain and a fraction of the electrons, such as less than 1% of the drain current, is captured in the charge trapping site. The same acceleration mechanism with reverse voltage polarity applies to the hot-hole generation for an erasing operation. The hot-carrier mechanism consumes a high power for the programming and erasing, which limits the total number of bits that can be simultaneously written in parallel. In addition, a fundamental drawback of the charge trapping memory using n+ doped source and n+ doped drain arises in 3D memory which commonly uses a polysilicon channel for the memory cell transistor. In order for the electrons or holes to become hot or energetic, the carries needs to be accelerated, yet any scattering events retard the acceleration. As a result, whereas the hot carrier generation is feasible in a single crystalline silicon channel, the same does not occur in conventional polycrystalline silicon channel, because the electrons and holes experience phonon scattering and grain boundary scattering in polysilicon channels; for example, such as is presented in a paper by Liu, Po-Tsun, C. S. Huang, and C. W. Chen. "Nonvolatile low-temperature polycrystalline silicon thin-film-transistor memory devices with oxide-nitride-oxide stacks." Applied physics letters 90.18 (2007). Therefore, the lucky electron injection model is usually not applicable for a polysilicon channel. As the channel of 3D charge trapping memory, also been referred to as 3D NOR-P in this invention, is formed by chemical vapor deposition (CVD), the channel tends to be polycrystalline. As a result, the hot-carrier generation in 3D charge trapping memory could be very difficult.

In order to solve the challenge associated with a polysilicon channel of hot-carrier generation in the 3D charge trapping memory, also been referred to as 3D NOR-P, presented in this invention and in the incorporated by reference patents and applications, a metal source and metal drain is presented, also been referenced to forming a Schottky barrier between Source or Drain and the channel. Unlike the conventional needs for the carrier to be accelerated traveling through channel from source for hot-carrier generation, for sources formed by metal-single crystalline silicon channel as well as metal-polycrystalline silicon channel, forms abrupt energy band banding in the Schottky junction. Thus, the carrier could be accelerated without the need to travel the channel. As a result, the hot-carrier is generated near the source side in a Schottky junction unlike the common case of single crystal pn junction in which the hot carriers are generated near the drain. Such mechanisms are discussed in many of the art presented in the related applications and patents incorporated by reference in here such as in papers by Shih, Chun-Hsing, et al. "Schottky barrier silicon nanowire SONOS memory with ultralow programming and erasing voltages." IEEE Electron Device Letters 32.11 (2011): by Shih, Chun-Hsing, et al., "Schottky barrier silicon nanowire SONOS memory with ultralow programming and erasing voltages." *IEEE Electron Device Letters* 32.11 (2011): 1477-1479; by Ho, Ching-Yuan, Yaw-Jen Chang, and Y. L. Chiou. "Enhancement of programming speed on gate-all-around poly-silicon nanowire nonvolatile memory using self-aligned NiSi Schottky barrier source/drain." *Journal of Applied Physics* 114.5 (2013): 054503; and by Chang, Wei, et al., "A localized two-bit/cell nanowire SONOS memory using Schottky barrier source-side injected programming." *IEEE Transactions on Nanotechnology* 12.5 (2013): 760-765, all of the foregoing in their entireties are incorporated by reference herein.

In addition to the hot-carrier generation in polysilicon channel, there is also important advantages in Schottky-junction based charge trapping memory (3D NOR-P). As explained earlier, in conventional channel hot carrier injection, different voltages need to be applied to the source and drain in order to create a flow of current through the channel and accelerate the carriers. Only a very small fraction of carriers are being used for the charge storage, thus wasting more than 90% of the power. In the charge trapping memory using Schottky barrier, the same voltage can be applied to the source and the drain so that no current flows across the source and the drain. Rather, the injected current from any or both sides of the source or drain tends to be captured in the change trapping layer because the electrical potential is formed for the carrier favorable to move toward the gate or wordline. This fact implies the writing and erasing can not only be fast but also consumes a much smaller writing power compared to the conventional pn junction. In fact, not only the conventional charge trapping memory using hot-carrier programming but also many of emerging memories such as MRAM, RRAM, and PRAM are constrained in parallel writing due to high write power. Therefore, such a constraint limits their use for wide bus width application, limiting massive parallelism. The Schottky junction charge trapping 3D memory (3D NOR-P) presented here and in the related applications and patents incorporated by reference herein could consume orders of magnitude lower write power, thus enabling wide bus width applications. The page size represents essentially the number of bits per row. The page size is the number of bits loaded into or written back from the sense amplifier when a row is activated. The page size of the Schottky junction charge trapping 3D memory (3D NOR-P) can be greater than 2 KB or 4 KB, or even greater than 16 KB. When the wide page size application is enabled, the clock frequency or timing parameters such as Row Address to Column Address Delay and Column Access Strobe—"CAS" latency can be relaxed, which can further reduce the power consumption. The wide bus width with relaxed timing parameter is particularly beneficial for mobile applications such as, for example, smartphones or tablets.

A 3D NOR-P memory using a Schottky junction and polycrystalline channel operation scheme is shown in FIG. 5A-5C. The dotted line in the FIG. 5A represent the energy band diagram for WL=BL=SL=0V. As is illustrated in FIG. 5A, for write '1', −1.5 V is applied to WL and 1.5 V is applied to SL/BL. The hot holes are injected from the Schottky junction and trapped into the charge trapping layer. In some cases, particularly wherein the Fermi level of the metal is pinned close to the conduction band of silicon, the trapped electrons are detrapped by FN tunneling. The trapped holes or removal of the trapped electrons decrease the threshold voltage. For a write '0', 1.5 V is applied to the WL and −1.5 V is applied to the SL/BL. The hot electrons are injected from the Schottky junction and trapped into the charge trapping layer. The trapped electrons increase the threshold voltage. In order to use WL=0V for the shut-off voltage to unselected rows, the target threshold voltage of state '1' is slightly greater, but not limited to, than 0V such as 0.2V~0.4V. For the unselected device, WL/SL/BL are grounded. For the half-selected cells, the voltage difference from WL to SL or WL to BL is 1.5 V, which could be a condition to be too small for Schottky junction tunneling. Therefore, the programming could be inhibited. As is illustrated in FIG. 5B-C, for read, the WL voltage of 1 V is applied so that the current difference due to threshold voltage difference can be sensed. The unselected WL is grounded so that minimal BL current flows regardless of the memory states. In order to use WL=1V for the read voltage to the selected row, the threshold voltage of the state '0' would be slightly greater, but not limited to, than 1 V such as 1.2V~1.4V.

Figure 5D:
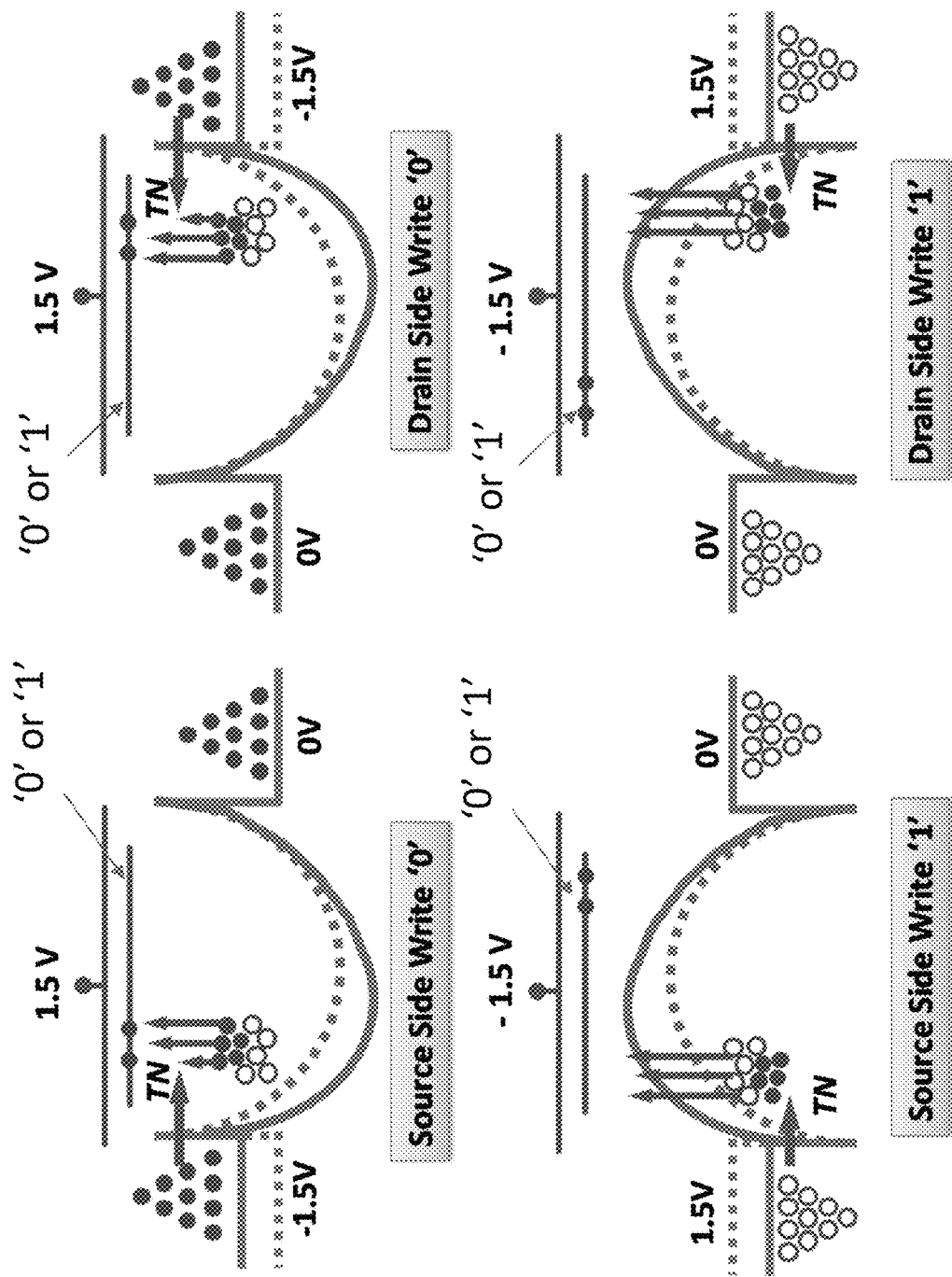
FIG. 5D is an exemplary illustration of a write scheme for mirror-bit operation of a memory cell.
Figure 5E:
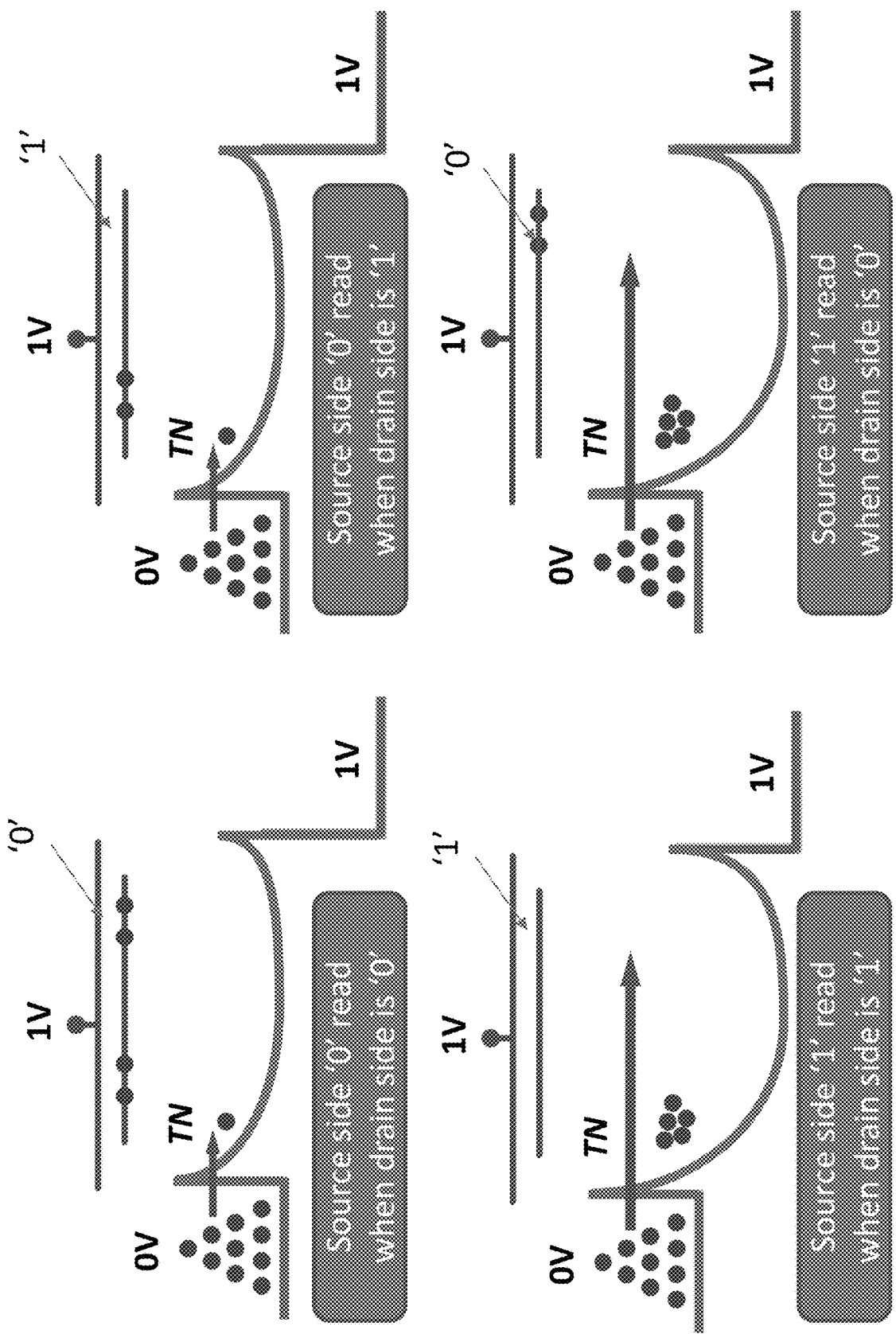
FIG. 5E is an exemplary illustration of a read scheme for mirror-bit operation of a memory cell.

As presented in the incorporated by reference art and related patents and application, alternative writing schemes could also be used. Different writing condition for 3D NOR-P type memory having Schottky Barrier is used to drive current through the channel to program or erase only close to the source-side or drain-side or both sides of Schottky junction. This allows two memory zones per channel, one near the source and another near the drain, as also known as a mirror-bit scheme. Such has been presented in reference to FIG. 17, FIG. 19, FIG. 21 and FIG. 23 of U.S. Pat. No. 10,014,318, incorporated by reference, and FIG. 13A-13D of patent application Ser. No. 16/337,665 (published as US 2019/0244933), incorporated by reference in its entirety. In some of the patents or applications incorporated by reference the reference to such 3D memory included similar terms to, such as, 3D charge trapping memory, 3D NOR, 3D NOR-P, 3D NOR-C. The unique advantages relating to the use of a metalized Source having a Schottky Barrier is relevant to all of these structure and perhaps far more so, for those techniques and structures utilize a polysilicon channel. The mirror-bit operation scheme in the 3D NOR-P memory using Schottky junctions and a polycrystalline channel operation scheme is shown in FIG. 5D-5E. The dotted line in the FIG. 5D represents the energy band diagram for WL=BL=SL=0V. As is illustrated in FIG. 5D, for write '1' into the source side, −1.5 V is applied to the WL, 1.5 V is applied to the SL, and 0V is applied to the BL (drain side). The hot holes are injected from only the source side's Schottky junction and are trapped into the charge trapping layer near the source whereas no significant hole injection takes place in the drain side's Schottky junction. Similarly, for write '1' into the drain side, −1.5 V is applied to the WL, 0 V is applied to the SL, and 1.5 V is applied to the BL (DL). The hot holes are injected from only the drain side's Schottky junction and trapped into the charge trapping layer near the drain whereas no significant hole injection takes place in the source side's Schottky junction. For write '0' into the source side, 1.5 V is applied to the WL, −1.5 V is applied to the SL, and 0V is applied to the BL (DL). The hot electrons are injected from only the source side's Schottky junction, whereas no significant electron injection takes place in the drain side's Schottky junction. Similarly, for write '0' into the drain side, 1.5 V is applied to the WL, 0 V is applied to the SL, and −1.5 V is applied to the BL (DL). The hot electrons are injected from only the drain side's Schottky junction, whereas no electron injection takes place in the source side's Schottky junction. When the write '0' or write '1' operation is made on one side of junction, the memory state of the opposite side does not affect its writing operation. In order to reduce disturb the memory state of one side against another side, the channel length of the memory transistor could be made greater than 100 nm. In this case, particularly the Fermi level of the metal is pinned close to the conduction band of silicon, the trapped electrons are detrapped by FN tunneling instead of hot hole injection. In this case, the block erase rather than bit-specific erase would be favored.

FIG. 5E illustrates the read operation for a source side read. In order to read the source side's memory state, the SL is grounded and a read voltage is applied to the BL (DL) and vice versa. The drain side read is not drawn but it is the reciprocal by swapping SL and BL (DL) voltages. For read, a voltage such as 1V is applied to the WL for both a source side as well as a drain side read. Other but different voltages are applied to the SL and BL (DL), and the current is measured to detect the threshold voltage associated with the charge trapping element. For example, SL=0V and BL=1V (DL=1V) is applied to sense the source side's storage state and SL=1V and BL=0V (DL=0V) is applied to sense the drain side's storage state. The threshold voltage is dominated by the charge trapped state near the ground node and the charge trapped states ('0' or '1') near the read voltage biased node is masked as illustrated in energy band diagram in FIG. 5E.

It should be noted that the use of 1V, 1.5V, −1.5V in FIGS. 5A-5E and the related description are just an examples and the specific voltages use in specific devices are highly related to the specific device structure and could be varied accordingly. An example of other operating voltages for Schottky Barrier based charge trap devices with polysilicon channel is presented in at least a paper by Chang, Wei, et al., "Drain-induced Schottky barrier source-side hot carriers and its application to program local bits of nanowire charge-trapping memories." *Japanese Journal of Applied Physics* 53.9 (2014): 094001, incorporated herein by reference in its entirety, illustrating these two writing modes in respect to its FIG. 4. While there could be many design considerations choosing device structure, operating method, and voltages, there is one aspect relating to the relatively low programming voltages presented in reference to FIGS. 5A-5E. A relatively low programming voltage could be used to form a relatively low threshold voltage shift, such as 1 volt, which could help overcome the ambipolarity of some Schottky barrier based devices. Such was presented also in PCT/US2018/016759, incorporated herein by reference, in reference to at least its FIG. 12A-12D.

Furthermore, in some devices the memory control circuits, such as 250 and 246, could include additional circuits such as controllers and sensors such as temperature sensors to support modifying these bias voltages. Such on the fly environmentally driven signal level modifications are common in memory devices and could be designed/adapted to compensate for various issues, including short time adaption and long term adaption. Such control could be used for many of the device operations including also changing the rate of refresh and other operation such as relate to at least FIGS. 6A-6G herein.

Figure 6B:
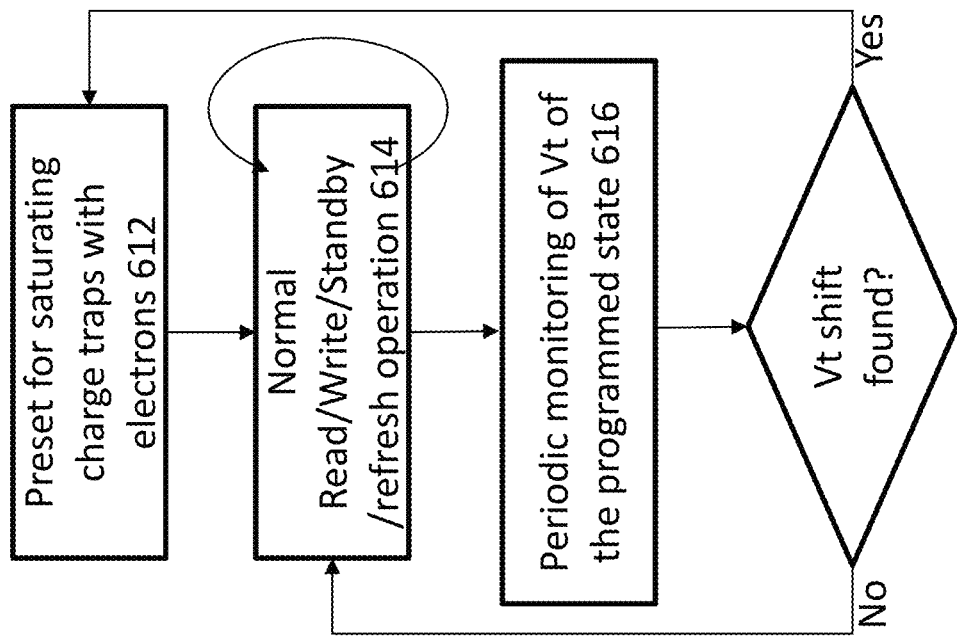
FIG. 6B is an exemplary illustration of an operational method for a charge trap memory.
Figure 6A:
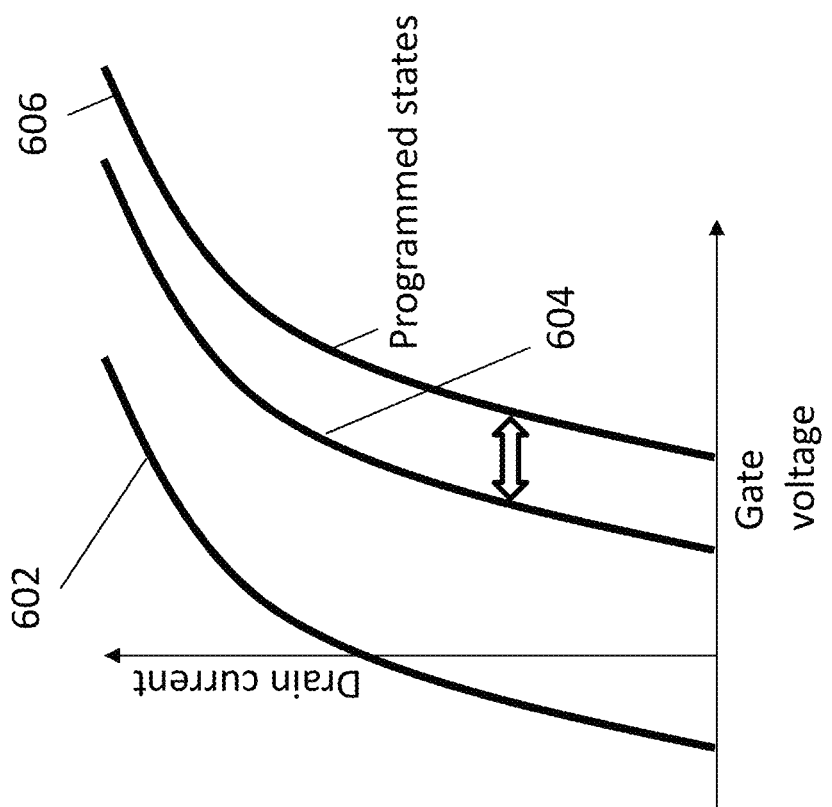
FIG. 6A is an exemplary illustration of a transfer curve of a charge trap memory cell.

FIG. 6A illustrates a transfer curve or drain current versus gate voltage characteristic of a charge trap memory cell. The threshold voltage transfer curve of the as-fabricated device 602 is determined by the native trap states. For the as-fabricated states, the threshold voltage is usually lower because the traps are mostly empty. Each trap that is capable of storing an electron has its own location and energy state. Some traps are located far from the channel and close to the blocking oxide but other traps are located far from the blocking oxide and close to the channel. Apart from its physical location, some traps have deep energy states but other traps have shallow energy states. Depending on its location and energy depth, the voltage and time required to store and remove electrons to these traps varies. For example, a higher voltage and/or longer pulse width may be required to fill/empty the traps close to the blocking oxide and the traps with deep energy states. However, a lower voltage and/or shorter pulse width may be required to fill/empty the traps close to the channel interface and the traps with shallow energy states. In this case, the deep energy state trap is often called a slow trap while the shallow energy state trap is often called a fast trap. During the formation of the charge trap layer, trap energy distribution is very random so it is almost impossible to exclusively fabricate a device with just fast traps. Accordingly an operational method could be adapted to nullify the effect of the slow traps. The method is illustrated as a flow chart in FIG. 6B. First, the charges traps with all energy states are fully saturated before normal operations such as read, write, hold, and refresh. This operation may be called the preset mode. The preset operation can be accomplished without a memory controller. For example, when the system power is turned on, the memory internal periphery circuit can conduct the preset operation during the calibration period. Alternatively, the preset operation can be conducted by order of memory controller. The preset can be conducted only once for its first use. Alternatively, the preset can be respectively conducted as for its functional maintenance. The preset mode would be similar to the program operation of the memory but with a higher word-line voltage and/or longer program pulse width. The preset mode is activated as initiation process 612 such as when the memory is booted. Then, during normal operation 614, the device controller uses write and erase voltages that are limited so not to disturb or remove those trapped electrons in the deep energy states. As a result, the transfer curve for the programmed state 606 would be similar to the transfer curve after the preset operation. For the erased state, the threshold voltage is lowered but not fully lowered 604. The amount of the threshold voltage shift ("Vt") therefore between the programmed state 606 and erased state 604 is determined by the amount of the shallow trap density. By nullifying the involvement of the deep traps, the charge trap memory may work at a higher speed. Assuming that the Vt for the cell with fully emptied charge trapped state is Vt,min and the Vt for the cell with saturated filled charge trapped state is Vt,max, only part of Vt window is used in this method of memory operation. The maximum capable Vt window is $\Delta Vt,max=Vt,max-Vt,min$, Vt of memory state '0'/programmed state could be similar to Vt,max but Vt of memory state '1'/erase state could be $Vt,max-\alpha \Delta Vt,max$, where $\alpha$ could be 0.05, 0.1 or 0.2. In other words, the programmed cell ('0') could be in a fully filled charge state and the erased state ('1') could be a partially emptied charge state which may be achieved by preferentially eliminating shallow trap level electrons. If required 616, the threshold voltage shift from the fully saturated state or programmed state could be monitored, and a preset mode could be intermittently triggered. Such a partial erase could be achieved by shortening the time of the erase operation by 50% or 80% or even more than 90%. So, for example, if for a specific memory structure the erase and full removal of the charge trapped could take more than a microsecond (µs), the partial erase could be performed in less than 0.5 µs or less than 0.1 µs or even less than 30 ns.

The concept presented with respect to FIGS. 6A-6B could also be used to improve other types of memory such as Ferroelectric ("FE") memories. Ferroelectric memory such as presented in respect to FIG. 24A-FIG. 26H of PCT/US2018/016759, incorporated herein by reference, are attractive as a high speed memory but considered to have a limited endurance of about $10^6$. An undesired charge trapping at the gate stack is a significant factor in the limiting of the memory endurance. The concept of shifting the memory threshold could help in nullifying the effect of this undesired charge trapping. This charge trapping is a very slow process and once charge has been trapped it will stay trapped for long time. Accordingly the memory block could be tested by the memory controller and the memory threshold could then be adjusted.

Figure 6C:
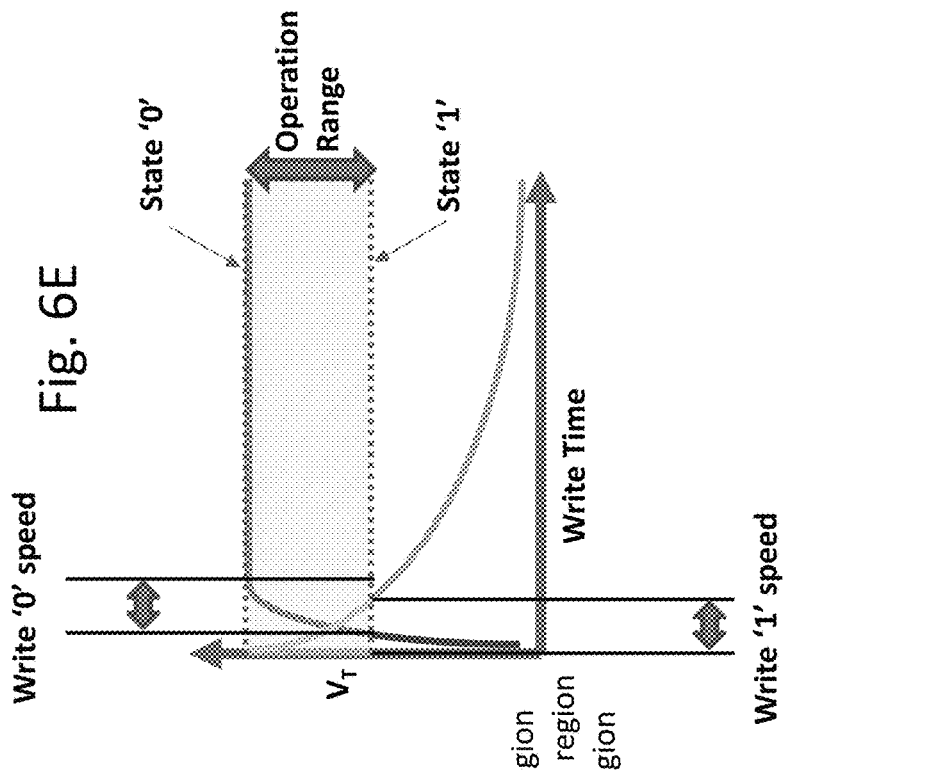
FIGS. 6C-6E are exemplary illustrations of the effects of a trap pre-saturation operation.
Figure 6D:
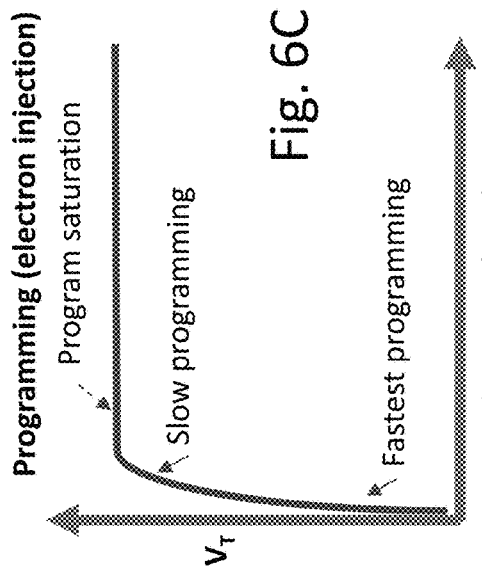
Figure 6E:
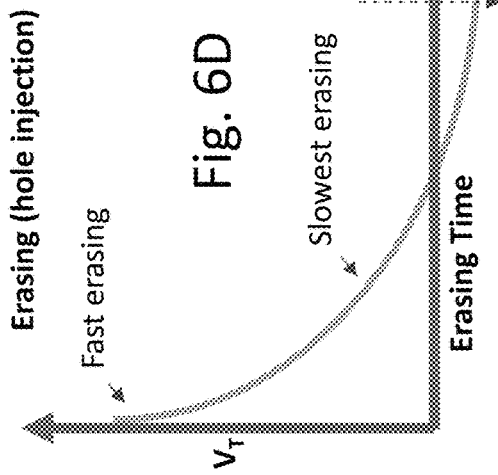

This concept could be further illustrated in respect to FIGS. 6C-6E. FIG. 6C illustrates charge trapping operation, i.e., threshold voltage shift for the charge traps from the empty state to an electron saturated state. As programming time increases, the threshold (Vt) shift grows as more electrons get trapped. Early on, the low energy trapping locations get filled up first and then the higher energy trapping locations are also filled up with electrons as the programming operation continues. Therefore, the programming rate is high in the early stages and the programming rate becomes lower as the trapping sites become saturated. A key aspect is a charge trapping structure that could be at a fully saturated threshold voltage within a reasonable Vt distribution. Such could be achieved by limiting the charge trapping layer volume by limiting the charge trapping layer thickness and developing a uniform quality nitride layer process having uniform trap density and trap energy distribution across chip area. Accordingly, the 3D memory could be structure with charge trapping layer thickness of less than 2 nm or 3 nm or 5 nm or 7 nm. The charge trap layer trapping capacity is highly dependent on its volume/thickness and the level of trapping sites in it which depend on layer material composition and formation process. Furthermore, the film integrity of the blocking oxide could be dense having inherently minimal trap density. The inverse would happen during an erase operation as is presented in FIG. 6D. Early on the low energy trapping sites get erased which is indicated by the fast reduction of the Vt shift because the charges trapped in the shallow level are favorably removed than those in the deep level. Then as the erase operation continues the electrons at the high energy trapping sites also get moved out, and if the erase operation continues some holes get trapped resulting in an "over-erased" state. In general, the programming rate is higher than the erasing rate. In order to obtain a balance between the program speed and the erase speed, the memory state threshold voltage window is partially utilized by maximizing the erase speed but compromising the programming speed as illustrated in FIG. 6E. First, the initialization process is necessary to fully saturate the threshold voltage shift by storing electrons in the charge trapping sites. This process may take long enough such that substantially all of the trap sites get programmed with electrons. Then the normal program and erase operation can follow. For the programmed state, the charge traps are fully filled with electrons. For the erased state, only charge traps with low trapping energies are selectively removed. The pulse width for the programming and erasing may be set to be the same. The programming pulse width is set to saturate the charge traps.

There might be the die to die or wafer to wafer variability in terms of its saturation Vt. In order to address those variability, the memory peripheral circuit may include built-in self-test (BIST). The BIST tests the program and erase voltage to meet a required programming and erasing timing parameters and reflect them into a programmable structure such as programmable resistors, anti-fuses, etc. Accordingly, a slightly different program, read, erase voltages could be used per every memory sub-array basis or memory bank basis. In addition, if the BIST results shows that some cells do not meet the required timing parameters, the memory structure could include redundancy so WL which include defective cells could be disabled and replaced with a WL for the redundant cells. Such a test is often called post-package-repair (PPR). In addition, the energy level and density of trapping sites could also change over time and accordingly over time the method suggested herein in respect to FIG. 6A-6D could include periodic adjustments to track device changes over time. Such could be at relatively high rate of hours in some applications, days in other applications or even months.

Figure 6G:
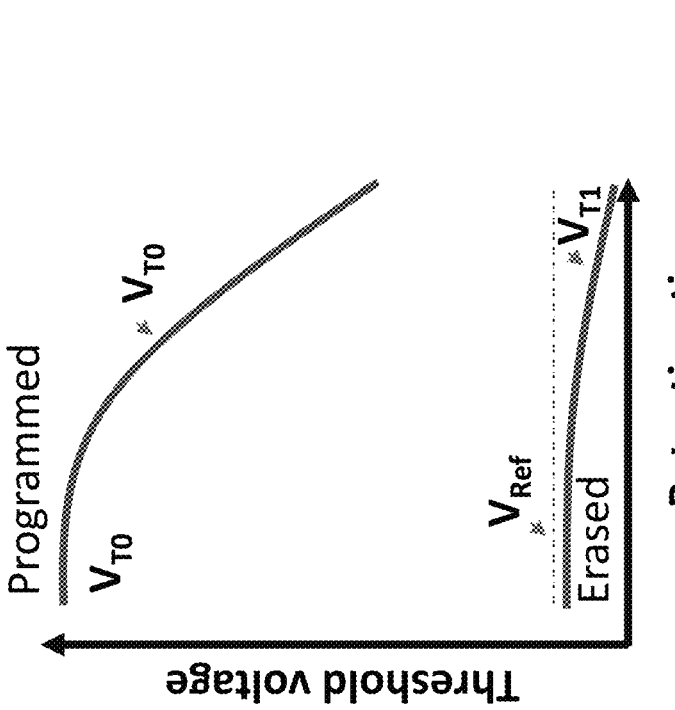
FIGS. 6F and 6G are exemplary illustrations of a pre-saturation mode charge trap memory threshold detection delta V.
Figure 6F:
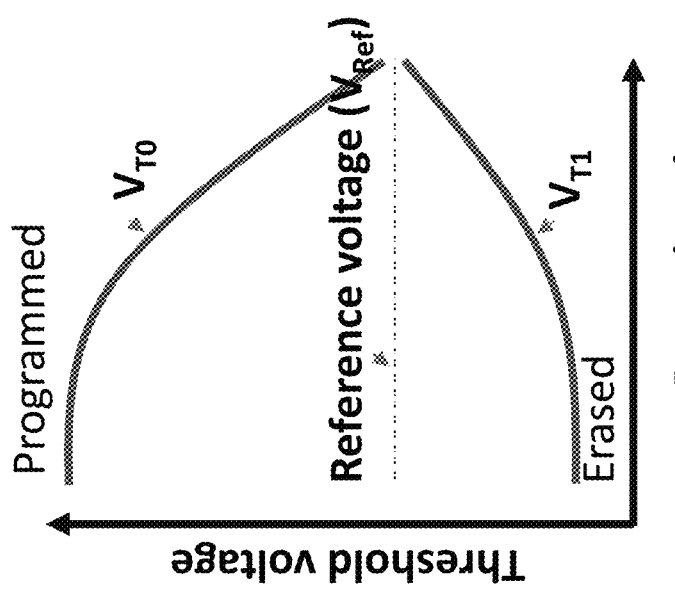

An additional benefit from the techniques presented here in reference to FIG. 6A-6E, called "Pre-Charging," relates to the memory retention time. FIG. 6F illustrates a conventional flash memory retention time chart that uses fully filled charge traps and fully emptied charge traps. The charge of the programmed cells is leaking out causing the threshold voltage associated with programmed cells $V_{T0}$ to move down, while the erased cell accumulates charge and their respective threshold voltage is moving $V_{T1}$ up, closing the memory window from both sides. Therefore, the reference voltage is set to very middle of $V_{T0}$ and $V_{T1}$. FIG. 6G illustrates the retention characteristics time chart for flash cells using Pre-Charging. It illustrates that, in this case, the threshold voltage for both $V_{T0}$ as well as $V_{T1}$ are moving down over time, because the data retention mechanism is electrons leaking for both programmed and erased states. Therefore, the reference voltage can be set to between $V_{T0}$ and $V_{T1}$ but much closed to $V_{T1}$. Accordingly, the Pre-Charging technique helps by extending retention time.

Such leakage is also a drawback, which could be overcome by the device controller periodically performing a self-test and 'refreshing' the pre-charging. Such a maintenance mode could utilize the idle time of the memory to avoid interfering with the device normal operation.

Figure 7B:
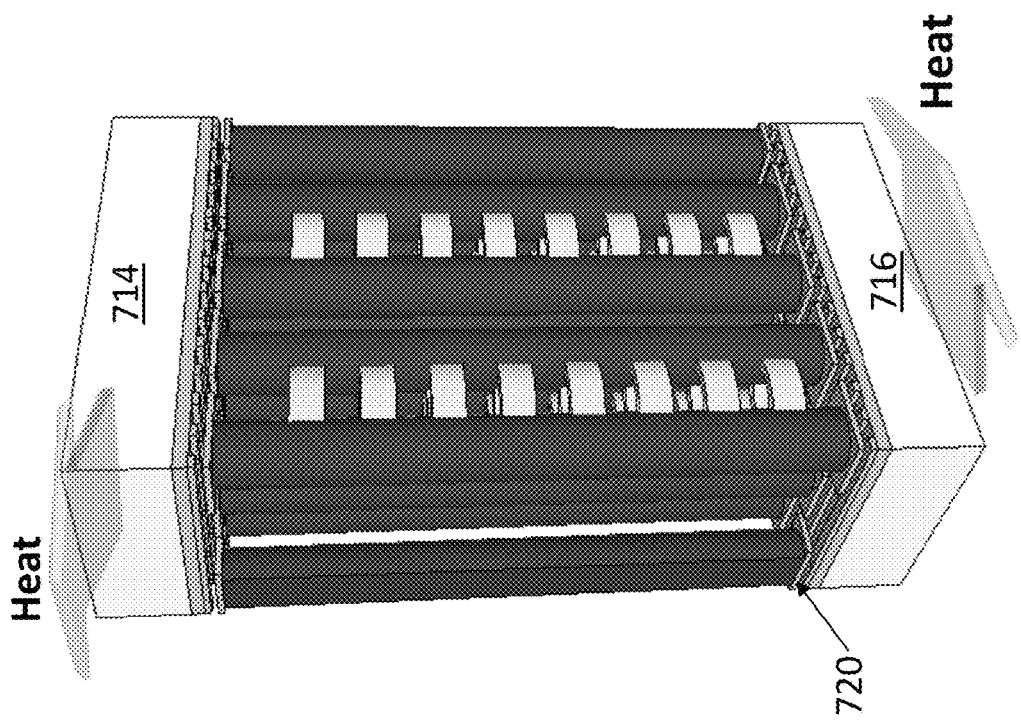
FIGS. 7A and 7B are exemplary illustrations of some of the advantages of metallic bit lines in a 3D NOR-P structure and device.
Figure 7A:
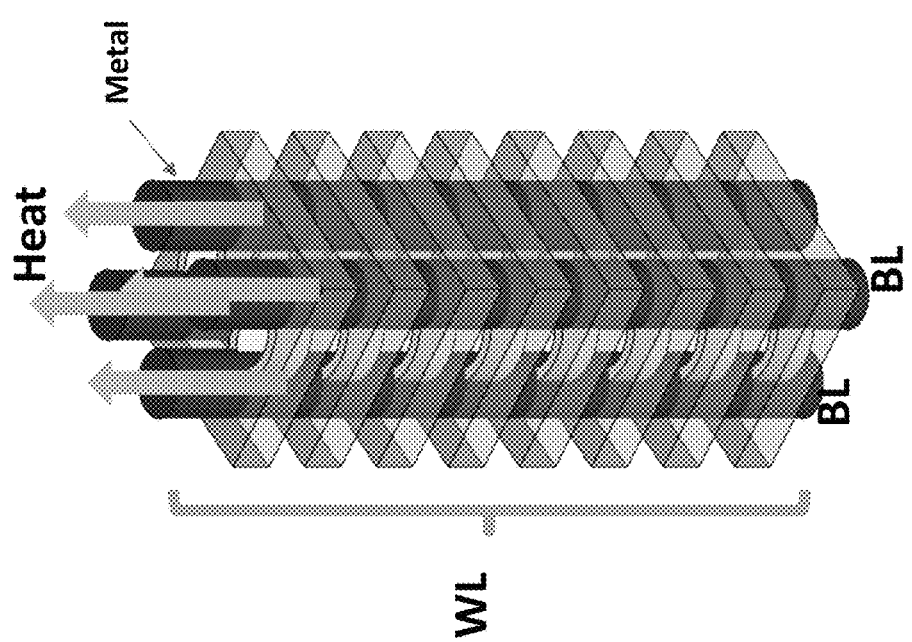

FIG. 7A illustrates an advantage for use of metallic bit lines (S/D). In general, the metal has a good thermal conductivity in comparison to all the other materials present in such a device. Therefore, these metallic pillars could help remove the heat from the inside of the 3D memory structure to the top or the bottom surface of the memory structure. The heat could be then conducted out to the device top surface or bottom surface. The device cooling then could affect the entire memory structure. It should be noted that conducting out the heat could be done without forming any leakage between these pillars. Such heat conductive techniques which do not form an electrically conductive path are known to artisans in the art and presented in some of the art incorporated herein by reference in the cases discussing heat removal; for example, at least U.S. Pat. Nos. 9,023,688 and 9,385,058.

FIG. 7B illustrates a portion of the device with top silicon substrate 714, and bottom silicon substrate 716. The device could comprise a thermal path, not shown, from the S/D pillars to these substrates 714, 716 without forming electrical path using techniques such as been presented in the incorporated by reference art. Landing pads 720 could include those types of structures which conduct heat but not electricity. The substrates could have good heat conduction. And from the substrate, the heat could be removed using techniques well known in the semiconductor industry.

The heat mobility through the metalized source or drain pillars as illustrated in FIG. 7A, could also be utilized in the other direction to bring heat into the channel to help initiate channel recrystallization as has been detailed herein with respect to Metal Induced Lateral Crystallization ("MILC") of the polysilicon channel.

The 3D NOR-P as presented herein could be used for high capacity DRAM applications. Artificial Intelligent ("AI") using Deep Neural Networks ("DNN") are becoming the driver of electronics systems and accordingly a growing part of the DRAM devices are use for these application. In such systems the majority of the memory access is for reads and less than 30% of the memory access is from writes. Such use cases work well with the 3D NOR-P technology presented herein. Yet while for conventional DRAM a group of memory bits could be accessed in parallel by having all of them controlled with the same wordline for read and for write, for 3D NOR-P the wordline voltage for write '1' (programming) is very different than for write '0' (erase). Accordingly the memory control needs to be different than in a DRAM. 3D NOR-P memory control could use two cycles; one for the bits that are to be programmed and one for the bits that need to be erased. Another alternative is to leverage the fine granularity of the 3D memory structure illustrated in FIG. 2 herein and FIG. 6 of PCT/US2018/52332. Accordingly the parallel access could be made to bits that do not share the same wordline. In such an access scheme, the memory control circuits could set the proper conditions independently to each of the memory cells being accessed. An artisan in the memory art can designed the detailed circuit for such a memory.

Figure 8:
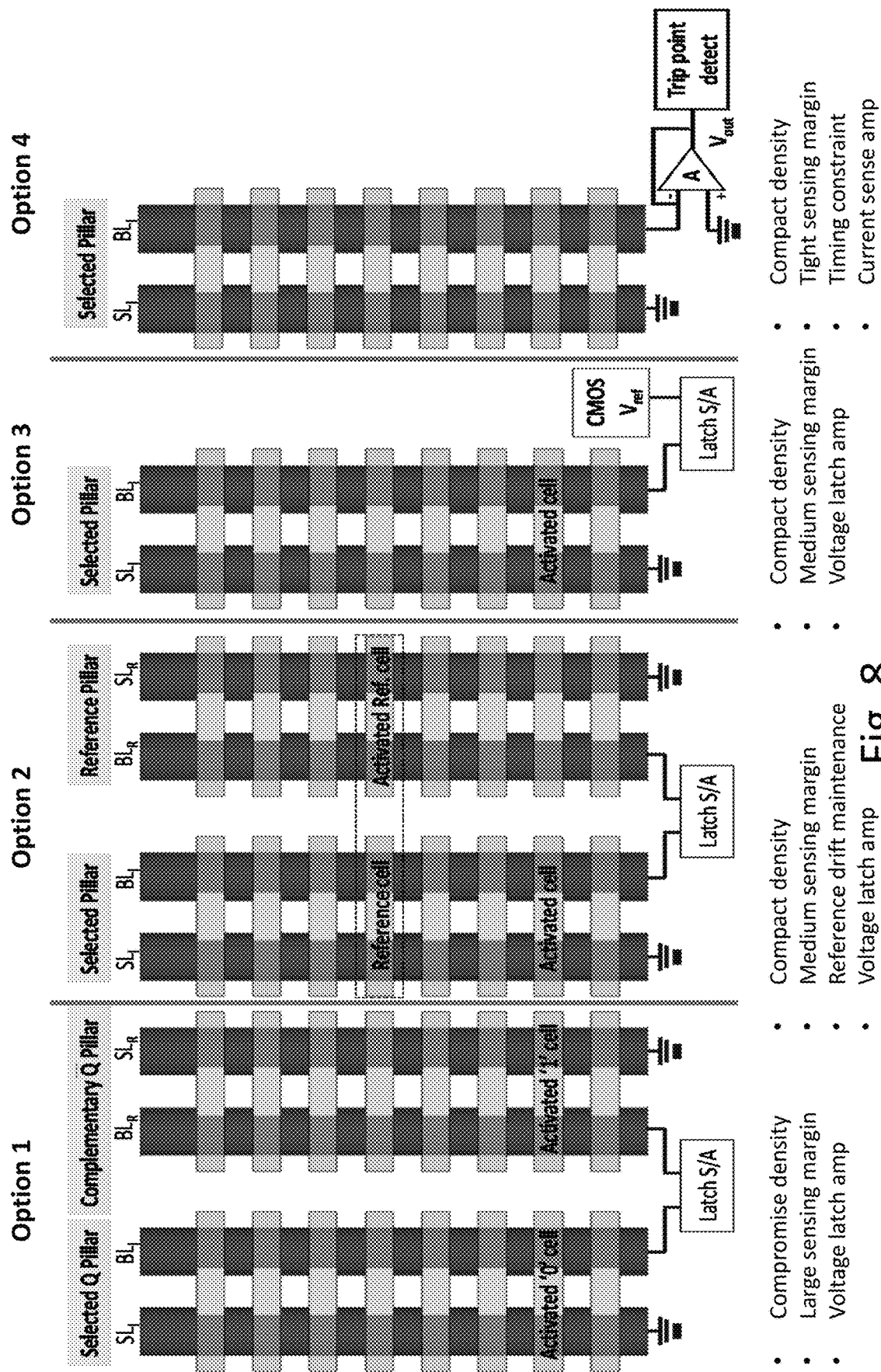
FIG. 8 is an exemplary illustration of various options for reading a 3D NOR-P device or structure.

FIG. 8 illustrates various options for reading a 3D NOR-P device or structure. Option 1 utilizes the differential mode memory scheme. In order to store one bit, two physical memory transistors are used wherein complementary bits are in each memory cell. One memory pillar structure has a complementary memory pillar structure that stores the complementary data. The memory pillar and complimentary memory pillar may be located within the same or different memory tiles or blocks. The same WL voltage for read is applied to both the selected WL and the complementary WL. The read operation can be accomplished by using a voltage latch sense amplifier, similar to the sensing for the double ended SRAM.

Option 2 utilizes memory transistors in a fixed layer in a pillar as dedicated reference transistors. The threshold voltages of the reference memory transistors are managed and maintained to the reference threshold voltage explained in FIG. 6G. The memory pillar for the reading and the reference pillar are located at different memory tiles or blocks. Therefore, only the WL voltage for read is applied to the selected WL layer but no WL voltage is applied to the same level of the reference pillar. During read, the reference WL voltage is applied to the reference WL layer of the reference pillar. The read operation can be accomplished by using a voltage latch sense amplifier, similar to the sensing for the double ended SRAM.

In option 3, the reference voltage may be synthesized by using CMOS logic transistors and used as a reference voltage. The read operation can be accomplished by using a voltage latch sense amplifier, similar to the sensing for the double ended SRAM.

In option 4, a current sensing method may be used to read, which uses the difference in current level for the difference in memory state. The current amplifier magnifies the level of the current, where the different current results in different voltage rising time. The trip point detect circuit senses the timing tacked for the output voltage to reach a certain level.

FIG. 9A illustrates a 3D NOR-P option having control logic circuitry, which is often called periphery under cell or cell over periphery. The S/D lines could be called bit lines or sometimes the Source lines could be called select-lines (SL) and the Drain-lines could be called bit lines. The planes such as WL layers are crossing multiple pillars. A sense amplifier is placed underneath every pillar and dedicated for each respective BL pillar.

FIG. 9B illustrates the fine-grained memory tile or block. One memory tile or block includes two BL pillars sharing a common global BL. The one BL pillar out of two BL pillars in the same memory block can be selected by using a two to one multiplexor. Alternatively, for larger grained memory tiles or blocks having n BL pillars sharing a common global BL, one out of n BL pillars can be selected by using an n-to-1 multiplexor. Then, the selected BL signal is connected to the global sense amplifier or row buffer. Alternatively, a local sense amplifier is placed underneath every fine-grained memory tile and dedicated for respective memory tiles (not drawn), and then fed into the global row buffer.

FIG. 9C illustrates the use of only global sense amplifiers by selecting only one out of many BLs. In this case, the BL capacitance is significantly reduced, thereby improving latency timing parameters.

One disadvantage of a 3D NOR-P device having an ultra-thin (less than 0.5 nm) tunneling oxide for DRAM applications is the extra energy associated with the memory refresh operation. Yet in most systems, the memory used is relatively large and could include multiple devices. In such systems most of the memory is in a hold state while only one device and only one section within the device is been accessed. An optional technique which could help reduce the need for refresh is a "Hold" state for the device or for device sections. In such a "Hold" state all the wordlines of the device or the section of the device being held in Hold state could be pulled high to a Hold voltage such as about 0.5 volt or about 1 volt or even higher than 1.5 volts. Such a Hold voltage for the wordlines could help keep the trapped charge trapped yet it is low enough not to cause more charge to be trapped. Such a Holding voltage could be removed and replaced with the normal operating voltage(s) once the device or the section being accessed or get other forms of instruction to get out of Hold state into normal operating state. Such holding voltage could be designed as active or passive (via diode) to nodes 402 of FIG. 4A or included as part of the memory control circuits. An artisan in the memory art can design the detailed circuit for such an improved memory control. This technique is also useful for mitigating memory cell Vt drift due de-trapping and leakage caused by total ionizing dose effects, for example, such as from gamma rays, for radiation hardening objectives.

An alternative concept could also be used to nullify the effect of this undesired charge trapping. This could allow managing the cases in which the undesired charge trapping is varying between different cells in the memory block. In such cases the read process could be replace with: $1^{st}$ Read, Write 'One', $2^{nd}$ Read and measure difference Δ between the results of $1^{st}$ Read, vs. the $2^{nd}$ Read. A cell that was 'One' the difference Δ would be smaller than a set threshold while a cell that was 'Zero' the difference Δ would be higher than the set threshold. Such a self-differential read cycle would need a final step of re-writing 'Zero' for the 'Zero' cells.

An additional alternative for high speed memory using the 3D NOR-P structure is the use of the FB-RAM concept as presented in reference to FIG. 29A-29D of PCT/US2018/016759, incorporated herein by reference. The FB-RAM could have a back-bias for keeping the charge in the floating body or to use a re-fresh such as the Auto-Refresh technique presented in respect to FIG. 86-FIG. 88 of U.S. Pat. No. 10,014,318, incorporated herein by reference. Such 3D NOR-P structure could use Source and or Drain pillars which have N+ type polysilicon at the outer ring and a core of metal; or even use the technology of Dopant Segregated Schottky Barrier ("DSSB") for at least the memory transistors.

The multi-level 3D structure could utilize a hybrid of memory types, for example, such as one with an ultra-thin tunneling oxide and others with thick tunneling oxide, as presented in the incorporated art such of PCT/US2016/52726, incorporated herein by reference, such as had been presented in sections [00121] to [00132] and such as in reference to its FIG. 16A-FIG. 17. These memory variations could be processed within the same 3D memory device allowing lower power transfer of data between the high speed cells to the long retention cells and other advantages.

It will also be appreciated by persons of ordinary skill in the art that the invention is not limited to what has been particularly shown and described hereinabove. For example, the use of SiGe as the designated sacrificial layer or etch stop layer could be replaced by compatible material or combination of other material including additive materials to SiGe like carbon or various doping materials such as boron or other variations. And for example, drawings or illustrations may not show n or p wells for clarity in illustration. Furthermore, any transferred layer or donor substrate or wafer preparation illustrated or discussed herein may include one or more undoped regions or layers of semiconductor material. Moreover, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus, the invention is to be limited only by appended claims

We claim:

1. A 3D memory device, the device comprising:
    a plurality of memory cells,
        wherein each memory cell of said plurality of memory cells comprises at least one memory transistor,
        wherein each of said at least one memory transistor comprises a source, a drain, and a channel; and
    a plurality of bit-line pillars,
        wherein each bit-line pillar of said plurality of bit-line pillars is directly connected to a plurality of said source or said drain, wherein said bit-line pillars are vertically oriented,
wherein said channel is horizontally oriented, and
wherein said channel is isolated from another channel disposed directly above said channel.

2. The device according to claim 1,
wherein each memory cell of said plurality of memory cells comprises a charge trap memory,
wherein said channel comprises polysilicon,
wherein said source and/or said drain comprises metal atoms, and
wherein said metal atoms enable hot electron programming of said charge trap memory.

3. The device according to claim 1,
wherein said channel comprises a circular shape or an ellipsoidal shape.

4. The device according to claim 1,
wherein said plurality of memory cells comprise a partially or fully metalized source, and/or a partially or fully metalized drain.

5. The device according to claim 1,
wherein said plurality of memory cells comprise a tunneling oxide thinner than 1 nm.

6. The device according to claim 1,
wherein said channel comprises crystallized polysilicon,
wherein said crystallized polysilicon was crystallized from heat originating from said source or said drain of said channel, and
wherein said channel comprises at least one crystallization front which originated in either said source or said drain of said channel.

7. The device according to claim 1,
wherein said at least one memory transistor is self-aligned to an overlaying another said at least one memory transistor, both being processed following the same lithography step.

8. A 3D memory device, the device comprising:
a plurality of memory cells,
    wherein each memory cell of said plurality of memory cells comprises at least one memory transistor,
    wherein each of said at least one memory transistor comprises a source, a drain, and a channel; and
a plurality of bit-line pillars,
    wherein each bit-line pillar of said plurality of bit-line pillars is directly connected to a plurality of said source or said drain,
    wherein said bit-line pillars are vertically oriented, and
    wherein said plurality of memory cells comprise a partially or fully metalized source, and/or a partially or fully metalized drain.

9. The device according to claim 8,
wherein each memory cell of said plurality of memory cells comprises a charge trap memory,
wherein said channel comprises polysilicon,
wherein said source and/or said drain comprises metal atoms, and
wherein said metal atoms enable hot electron programming of said charge trap memory.

10. The device according to claim 8,
wherein each of said memory transistors is directly connected to at least one of said plurality of bit-line pillars.

11. The device according to claim 8,
wherein said channel is horizontally oriented and comprises a channel width greater than 5 nm and less than 25 nm.

12. The device according to claim 8,
wherein said plurality of memory cells comprise a tunneling oxide thinner than 1 nm.

13. The device according to claim 8,
wherein said channel comprises a circular shape or an ellipsoidal shape.

14. The device according to claim 8,
wherein said at least one memory transistor is self-aligned to an overlaying another said at least one memory transistor, both being processed following the same lithography step.

15. A 3D memory device, the device comprising:
a plurality of memory cells,
    wherein each memory cell of said plurality of memory cells comprises at least one memory transistor,
    wherein each of said at least one memory transistor comprises a source, a drain, and a channel; and
a plurality of bit-line pillars,
    wherein each bit-line pillar of said plurality of bit-line pillars is directly connected to a plurality of said source or said drain,
    wherein said bit-line pillars are vertically oriented, and
    wherein said channel comprises crystallized polysilicon.

16. The device according to claim 15,
wherein each memory cell of said plurality of memory cells comprises a charge trap memory,
wherein said channel comprises polysilicon,
wherein said source and/or said drain comprises metal atoms, and
wherein said metal atoms enable hot electron programming of said charge trap memory.

17. The device according to claim 15,
wherein each of said memory transistors is directly connected to at least one of said bit-line pillars.

18. The device according to claim 15,
wherein said plurality of memory cells comprise a partially or fully metalized source, and/or a partially or fully metalized drain.

19. The device according to claim 15,
wherein at least one of said plurality of said memory cells comprise a tunneling oxide thinner than 1 nm.

20. The device according to claim 15,
wherein said at least one memory transistor is self-aligned to an overlaying another said at least one memory transistor, both being processed following the same lithography step.

* * * * *